(12) United States Patent
Matsubara

(10) Patent No.: US 6,492,735 B1
(45) Date of Patent: Dec. 10, 2002

(54) SEMICONDUCTOR DEVICE WITH ALLOY FILM BETWEEN BARRIER METAL AND INTERCONNECT

(75) Inventor: Yoshihisa Matsubara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/661,323

(22) Filed: Sep. 13, 2000

(30) Foreign Application Priority Data

Sep. 21, 1999 (JP) .......................................... 11-267444

(51) Int. Cl.[7] ..................... H01L 21/3205; H01L 23/52; H01L 29/40; H01L 23/48
(52) U.S. Cl. ....................... 257/760; 257/761; 257/758; 257/763; 257/764; 257/762; 257/774; 257/751; 257/700; 257/701; 257/741
(58) Field of Search ................................. 257/760, 758, 257/766, 741, 751, 761, 762, 763, 764, 774, 700, 701

(56) References Cited

U.S. PATENT DOCUMENTS

| 6,136,682 A | * 10/2000 | Hegde et al. ................ 438/622 |
| 6,156,651 A | * 12/2000 | Havemann ................... 438/674 |
| 6,201,291 B1 | * 3/2001 | Kordic et al. ................ 257/544 |
| 6,287,954 B1 | * 9/2001 | Ashley et al. ............... 438/622 |
| 6,329,234 B1 | * 12/2001 | Ma et al. ..................... 257/301 |
| 2001/0018273 A1 | * 8/2001 | Park et al. ................... 438/762 |
| 2001/0045651 A1 | * 11/2001 | Saito et al. .................. 257/750 |
| 2001/0051426 A1 | * 12/2001 | Pozder et al. ................ 257/739 |
| 2001/0051442 A1 | * 12/2001 | Besser et al. ................ 438/597 |
| 2001/0055878 A1 | * 12/2001 | Chooi et al. ................. 438/687 |

FOREIGN PATENT DOCUMENTS

JP 11-330236 11/1999

* cited by examiner

Primary Examiner—Alexander O. Williams
(74) Attorney, Agent, or Firm—Young & Thompson

(57) ABSTRACT

Between a copper film 5a and a tantalum-based barrier metal film 2b, there is set an alloy layer 10 made through the reaction of the material of the barrier metal film and copper.

8 Claims, 18 Drawing Sheets

(a)

(b)

SEMICONDUCTOR DEVICE WITH ALLOY FILM BETWEEN BARRIER METAL AND INTERCONNECT

BACKGROUND OF THE INVENTION

1. Field of the Invention

The present invention relates to a semiconductor device having an interconnection and a via plug, and a manufacturing method thereof

2. Description of the Related Art

In recent years, to meet the requirements for higher speed of semiconductor elements, low-resistance materials such as copper have become widely utilized as the metal for interconnections. However, because etching copper is difficult, interconnection layers are normally formed through a so-called damascene process.

In a semiconductor device wherein copper interconnection layers are laid through the damascene process, every interconnection layer is required to have a via plug so as to connect to the other layers. The metal material normally employed for the via plug is copper or tungsten. Tungsten is particularly in wide use, as it has the advantage of good adaptability to fill up any space.

FIG. 2 shows a conventional copper interconnection structure with a tungsten plug. In the structure shown in the drawing, a silicon oxide film 1a, a silicon oxynitride (SiON) film 11, a silicon oxide film 1b, a silicon oxynitride film 12, a silicon oxide film 1c, a silicon oxynitride film 13 and a silicon oxide film 1d are laid in this order on a semiconductor substrate that is omitted from the drawing.

Within the silicon oxide film 1a, there is formed a contact plug connecting with a diffusion layer of the semiconductor substrate. The contact plug is composed of a barrier metal film 6a made of Ti/TiN and a tungsten film 3a. Within the silicon oxide film 1b, a first copper interconnection connecting with the upper surface of the above-mentioned contact plug is formed. The first copper interconnection is composed of a tantalum-based barrier metal film 4a and a copper film 5a. Within the silicon oxide film 1c, there is formed an interlayer via plug connecting the upper surface of the first copper interconnection. The interlayer via plug is composed of a titanium-based barrier metal film 6b and a tungsten film 3b. Within the silicon oxide film 1d, a second copper interconnection connecting with the upper surface of the interlayer through hole is formed. The second copper interconnection is composed of a tantalum-based barrier metal film 4b and a copper film 5b.

Now, referring to FIGS. 10 to 12, a manufacturing method of the conventional interconnection structure of FIG. 2 is described below.

FIG. 10(a) is a cross-sectional view illustrating the step of the manufacturing method at a stage where formation of the contact plug and the first copper interconnection has completed. The steps which bring the state of FIG. 10(a) are first described. Firstly, after a silicon oxide film 1a is grown on a semiconductor substrate (not shown in the drawing) where elements such as a transistor are formed, a through hole is formed by dry etching, and then a barrier metal film 6a and a tungsten film 3a are formed in this order so as to fill up the inside of the through hole. Subsequent planarization is carried out by the CMP (Chemical Mechanical Polishing) and thereby formation of a tungsten plug is accomplished. Next, after growing a silicon oxynitride film 11 and a silicon oxide film 1b, an interconnection trench is formed within these films and, then, a tantalum-based barrier metal film 4a for which layers of Ta and TaN are laid in this order and a copper film 5a are formed in this order so as to fill up the inside of the trench. Subsequent planarization by the CMP accomplishes formation of a copper interconnection. Next, after a silicon oxynitride film 12 and a silicon oxide film 1c are grown, a resist film 15 patterned into a prescribed shape is formed thereon, and thus, the state of FIG. 10(a) is attained.

Subsequently, dry etching with a fluorocarbon-based gas is carried out till the silicon oxynitride film 12 is exposed and a through hole 16 is formed, and then, by means of oxygen plasma ashing or the like, the resist film 15 is removed.

Next, using a different etching gas, the silicon oxynitride film 12 is etched (FIG. 10(c)).

Subsequently, after a titanium film is grown over the entire surface of the silicon oxide film 1c by the sputtering method, a titanium nitride film is grown by the reactive sputtering method. The reactive sputtering method herein is carried out by using a Ti target and making the sputtered particles therefrom react with nitrogen before reaching the semiconductor substrate. In this manner, formation of a titanium-based barrier metal film 6b composed of layers of titanium/titanium nitride is accomplished.

Next, a tungsten film 3b is deposited (FIG. 11(a)). As the material gads thereat, a gas containing $WF_6$ is, for example, utilized. The deposition of the tungsten film is normally carried out in two steps, the step of forming growth nuclei and the step of forming a bulk tungsten film.

First, the step of forming growth nuclei is performed. In this instance, the growth gas utilized is a mixed gas of $WF_6$, $SiH_4$ and Ar, and the deposition temperature (substrate temperature) is set at about 450° C. When a tungsten film is grown to a prescribed thickness under these conditions, the supply of the gas is, at any rate, once stopped, and thereby the step of forming growth nuclei terminates.

Following that, with $WF_6$ and $H_2$ being supplied to the deposition chamber, a bulk tungsten film is grown to fill up the inside of the hole. This reaction is normally made under the $H_2$ reducing condition where the growth rate of the film is faster than that in the step of growing nuclei. In this instance, the growth gas utilized is a mixed gas of $WF_6$, $H_2$ and Ar, and the deposition temperature (substrate temperature) is set at about 450° C. Now, with this film growth, the inside of the through hole is completely filled up with tungsten. Next, by polishing the tungsten film by the CMP, the portion of the tungsten film 3b lying outside of the through hole is removed so that the tungsten film 3b is left only in the through hole, which accomplishes formation of a tungsten plug (FIG. 11(b)).

Next, after growing a silicon oxynitride film 13 and a silicon oxide film 1d, an interconnection trench is formed within these films (FIG. 12(a)) and, then, a tantalum-based barrier metal film 4b for which layers of Ta and TaN are laid in this order and a copper film 5b are formed in this order so as to fill up the inside of the trench (FIG. 12(b)). Subsequent planarization by the CMP accomplishes formation of an upper layer copper interconnection (FIG. 12(c)). Formation of a semiconductor device having interconnections and a tungsten plug is thereby accomplished.

The conventional technique described above has, however, problems that, in the region between the tungsten film 3b and the copper film 5a of FIG. 2, the titanium-based barrier metal film 6b may become degenerate and besides, the section of the copper film 5a that is in contact with the titanium-based barrier metal film 6b may become corroded.

The occurrence of degeneration of the barrier metal film as well as corrosion of the copper film of these sorts has not been fully recognized thus far, but the investigation conducted by the present inventors confirmed that such phenomena indeed take place. It is considered that these phenomena result from the fact that a titanium-based material and copper are liable to react with each other. When the standard steps of growing films in the prior art are employed, the titanium-based material and copper interact rapidly and excessively, which leads to the degeneration of the barrier metal film and the corrosion of the copper film. Consequently, the conventional technique described above has the following problems.

The first problem is a lowering of electromigration resistance in the region between the tungsten film 3b and the copper film 5a, since the electromigration resistance becomes low in the degenerated section of the barrier metal film as well as in the corroded section of the copper film.

The second problem is the proneness of the detachment of films on the interface between the titanium-based barrier metal film 6b and the copper film 5a. This is caused by poor adhesion the degenerated section of the barrier metal film has to the tungsten film and the like, together with poor adhesion the corroded section of the copper film has to the barrier metal film. Because of this, when subjected to heating in the later steps of growing films and the like, or during the step of wire bonding after completion of the chip fabrication, stress may be applied to the region between the via plug and the copper interconnection, which makes the detachment liable to happen.

The third problem is an increase in contact resistance on the interface between the titanium-based barrier metal film 6b and the copper film 5a as well as an increase in interconnection resistance of the copper interconnection. This is brought about by high electrical resistance of the degenerated section of the barrier metal film and that of the corroded section of the copper film.

In short, the conventional technique is accompanied with the problems that, on the interface between the copper interconnection and the via plug, the electromigration resistance may be lowered, the detachment may become liable to happen, and the contact resistance and the interconnection resistance may be increased.

The above problems may become even greater due to a factor in the step described below. After etching for the removal of the silicon oxynitride film 12 is completed as seen in FIG. 10(c), the step of removing the etching residue is normally performed, using a resist stripper agent such as an amine-containing agent. Such a treatment, however, oxidizes or degenerates the exposed surface of the copper film and reduces the adhesion between the barrier metal film and the copper film further. That is, to the reduction of adhesion resulting from the interaction between the material of the barrier metal film and copper, a further reduction of adhesion caused by the peeling agent is added. Therefore, if the above step is employed, problems of the lowering of electromigration resistance, the occurrence of the detachment and increases in contact resistance and interconnection resistance become greater.

Meanwhile, along with the element miniaturization, thinning of the copper film is presently proceeding so that even a slight increase in contact resistance between the barrier metal film and the copper film or in interconnection resistance considerably hinders the high-speed operation of the elements. Therefore, the problem of the increase in resistance that is brought about by the reduction of adhesion between the barrier metal film and the copper film becomes particularly significant when the copper film is made thin, for example, when its film thickness is not exceeding 300 nm.

SUMMARY OF THE INVENTION

Accordingly, an object of the present invention is to increase adhesion on the interface between a copper interconnection and a via plug that is formed thereon, and thereby achieve an improvement of the electromigration resistance, an improvement of adhesion and reductions of contact resistance as well as interconnection resistance.

In light of the above problems, the present invention provides a semiconductor device which has, on a semiconductor substrate:

an interconnection layer made of copper-based metal; and a via plug formed in contact with the upper surface of said interconnection layer; wherein, said via plug comprises a conductive film and a barrier metal film that covers the lateral and bottom surfaces of said conductive film; and said barrier metal film covering the bottom surface of the conductive film and said interconnection layer are separated by an alloy layer made through the reaction of the material of said barrier metal film and said copper-based metal.

In the semiconductor device of the present invention, the introduction of an alloy layer made through the reaction between the material of the barrier metal film and copper-based metal markedly improves adhesion between the interconnection layer and the via plug, and attains an improvement of the electromigration resistance, an improvement of adhesion and reductions of contact resistance as well as interconnection resistance.

Hitherto, it has been hardly recognized that the titanium-based material constituting the barrier metal film reacts with copper and an alloy layer is formed. In consequence, a feasibility of a technique to improve adhesion between the via plug and the interconnection layer through an appropriate control over the reaction of alloy layer formation or practical methods to perform such an appropriate control over the reaction of alloy layer formation has little studied. The present inventors made various investigations over these matters and, as a result, found out that, if an alloy layer is formed with its film thickness well under control, adhesion between the interconnection layer and the via plug can be improved with effect and reached the present invention.

The investigations by the present inventors indicate that the alloy layer made through the reaction of the material of the barrier metal film and copper is formed with the barrier metal film material and copper interacting each other in the vicinity of the surfaces of the barrier metal film and the copper interconnection. It should be noted, however, that a mere formation of an alloy layer alone cannot improve adhesion between the interconnection layer and the via plug sufficiently, and production of a layered structure in which an alloy layer and a barrier metal film are laid over the copper interconnection in this order is called for. In other words, it is essential to leave a part of the barrier metal film that lies under the conductive film and constitutes the via plug as an unreacted layer. Referring to FIG. 13, this point is further described below.

In FIG. 13, within a silicon oxide film 41, there is formed a copper interconnection layer in which a copper film 43 is embedded over a barrier metal film 42 in the form of damascene. A silicon oxide film 44 is applied over that and an interlayer via plug connecting with the upper surface of the copper interconnection is formed therein. The interlayer via plug comprises a barrier metal film 46 and a tungsten film 47. If the material of the barrier metal film and copper interact excessively, the resulting structure becomes the one shown in FIG. 13(b), wherein the tungsten film 47 and an alloy layer 45 come to direct contact with each other. Since adhesion between the tungsten film 47 and the alloy layer 45 is not good, with such a structure, it is difficult to solve the problems of the electromigration resistance, the interface detachment and the increases of contact resistance and interconnection resistance. Therefore, in a semiconductor device of the present invention, the interconnection layer and the barrier metal film covering the bottom surface of the conductive film are separated by an alloy layer made through the reaction of the material of the barrier metal film and copper, making up a layered structure in which copper-based metal, the alloy layer and the barrier metal film are laid in this order. That is, as shown in FIG. 13(a), there is formed a structure in which the barrier metal film 46 is interposed between the tungsten film 47 and the alloy layer 45. It is due to such a structure that adhesion between the interconnection layer made of copper-based metal and the via plug formed thereon can be improved, and, consequently, an improvement of the electromigration resistance, an improvement of adhesion and reductions of contact resistance as well as interconnection resistance can be achieved.

As described above, in the present invention, an alloy layer that contributes to an improvement of adhesion is formed, whole a part of the barrier metal film is left as an unreacted layer, and, thus, a layered structure of an alloy layer and an unreacted layer of the barrier metal film is provided. The structure of this sort can be obtained by choosing an appropriate deposition temperature for the conductive film that constitutes the via plug, with the film thickness and the deposition method of the barrier metal film taken into consideration.

Further, the present invention provides methods of manufacturing a semiconductor device with an afore-mentioned structure, as follows.

Namely, the present invention provides a method of manufacturing a semiconductor device, which comprises the steps of:

forming an interconnection layer of copper-based metal on a semiconductor substrate;

forming an insulating film over said interconnection layer and thereafter, within said insulating film, making a through hole down to said interconnection layer;

growing a titanium-containing barrier metal film over the entire surface and thereafter growing a conductive film over said barrier metal film so as to fill up said through hole; and performing either chemical mechanical polishing or etching back in such a way that said conductive film is left only inside of said through hole; wherein, in the step of growing said conductive film, concurrently with growing the conductive film, a part of the barrier metal film is made to react with said copper-based metal so that, at the bottom of said through hole, there is formed a layered structure in which an alloy layer made through the reaction of copper-based metal and titanium and an unreacted layer of the barrier metal film are laid in this order.

The titanium-based material is highly reactive to copper. Therefore, in the case that tungsten is employed as the material of the via plug in the conventional method, in the step of growing a tungsten film, the titanium-based material constituting the barrier metal film reacts with copper excessively, and the titanium-based material under the tungsten plug is completely used up for the reaction. Furthermore, because the titanium-based material and copper interact very rapidly, it is difficult to obtain a reactive layer of high film quality, possible to contribute to an improvement of the interface adhesion. In contrast with this, the present invention can sufficiently improve the adhesion between the interconnection layer and the via plug, since, at the bottom of the via plug, there is formed a structure in which an alloy layer made through the reaction of the copper-based metal and titanium and a barrier metal film are laid in this order.

Further, the present invention provides a method of manufacturing a semiconductor device, which comprises the steps of:

forming an interconnection layer of copper-based metal on a semiconductor substrate;

forming an insulating film over said interconnection layer and thereafter, within said insulating film, making a through hole down to said interconnection layer;

growing a tantalum-containing barrier metal film over the entire surface and thereafter growing a conductive film over said barrier metal film so as to fill up said through hole; and performing either chemical mechanical polishing or etching back in such a way that said conductive film is left only inside of said through hole; wherein, in the step of growing said conductive film, concurrently with growing the conductive film, a part of the barrier metal film is made to react with said copper-based metal so that, at the bottom of said through hole, there is formed a layered structure in which an alloy layer made through the reaction of copper-based metal and tantalum and an unreacted layer of the barrier metal film are laid in this order.

In this invention, a tantalum-based material is utilized for the barrier metal film. As the material for the barrier metal film in the tungsten plug, titanium-based materials have been, hitherto, widely used. However, reactivity of titanium to copper is considerably high so that there are instances where it is difficult to control the reaction of the alloy layer formation with a high accuracy. For example, in depositing titanium into the through hole, the titanium-based film at the bottom of the hole may not grow sufficiently thick and the film thickness thereof may remain thin. In such a case, the titanium-based film is liable to be used up for the reaction of the alloy layer formation, and the layered structure in which the alloy layer and the barrier metal film are laid in this order becomes difficult to obtain. Against this, if a tantalum-based material is employed as the material for the barrier metal film, the reaction of the alloy layer formation proceeds gently so that the reaction can be controlled with a high accuracy and the layered structure in which the alloy layer and the barrier metal film are laid in this order can be obtained with relative ease. Further, because the alloy layer made through the reaction of tantalum and copper surpasses the alloy layer made through the reaction of titanium and copper in mechanical strength and adhesion with other films, the effects of an improvement of the electromigration resistance, an improvement of detachment resistance and the reductions of contact resistance as well as interconnection resistance, for this particular invention, become more pronounced.

In either of the above methods of manufacturing a semiconductor device according to the present invention, in the step of growing a conductive film, concurrently with growing a tungsten film, a part of the barrier metal film is made to react with the copper-based metal so that, at the bottom of the through hole, there is formed a layered structure in which an alloy layer made through the reaction of copper-based metal and the material of the barrier metal film and the barrier metal film are laid in this order. The layered structure of this sort can be obtained through an appropriate control over the reaction of the alloy layer formation.

The control of the reaction of the alloy layer formation can be made by choosing the film thickness and the deposition method of the barrier metal film, the deposition conditions of the conductive film (tungsten or the like) that fills up the via plug and the like in an appropriate manner. Nevertheless, it is particularly important that the optimum deposition temperature for the conductive film is chosen, with the film thickness and the deposition method of the barrier metal film taken well into consideration, because the reaction of the alloy layer formation proceeds mostly at the time of growing the conductive film. Although the reaction of the alloy layer formation can be controlled through conditions for a heat treatment performed in one of the steps after completing the formation of the conducive film, this can hardly provide a good control of the film thickness of the alloy layer with a high accuracy. Meanwhile, the investigations of the present inventors revealed that the crucial factor to control the film thickness of the alloy layer with a high accuracy is the deposition temperature and the like at the time a conductive film of tungsten or the like is grown over the barrier metal film after completion of its growth, and further confirmed that, by controlling that, an alloy layer can be formed with its film thickness well under control.

The deposition temperature of a conductive film as used herein is the deposition temperature "in the step of growing a conductive film so as to fill up the through hole", and, for example, when tungsten is utilized as the material of the conductive film, it is the deposition temperature of a bulk tungsten film. The deposition of the tungsten film inside of the through hole is normally carried out in two steps, the step of forming a tungsten film for the formation of growth nuclei and the step of forming a bulk tungsten film to fill up the hole. In short, in order to control the reaction for the alloy layer formation and control its film thickness well, the deposition temperature in the step of forming a bulk tungsten film is important.

Further, a copper-based metal film as used in the present invention is a film whose main component is copper and whose copper content is not less than 90% by weight. Further, in the present invention, as a conductive film, a tungsten film, for example, can be employed.

DETAILED DESCRIPTION OF THE PREFERRED EMBODIMENTS

Figure 6:
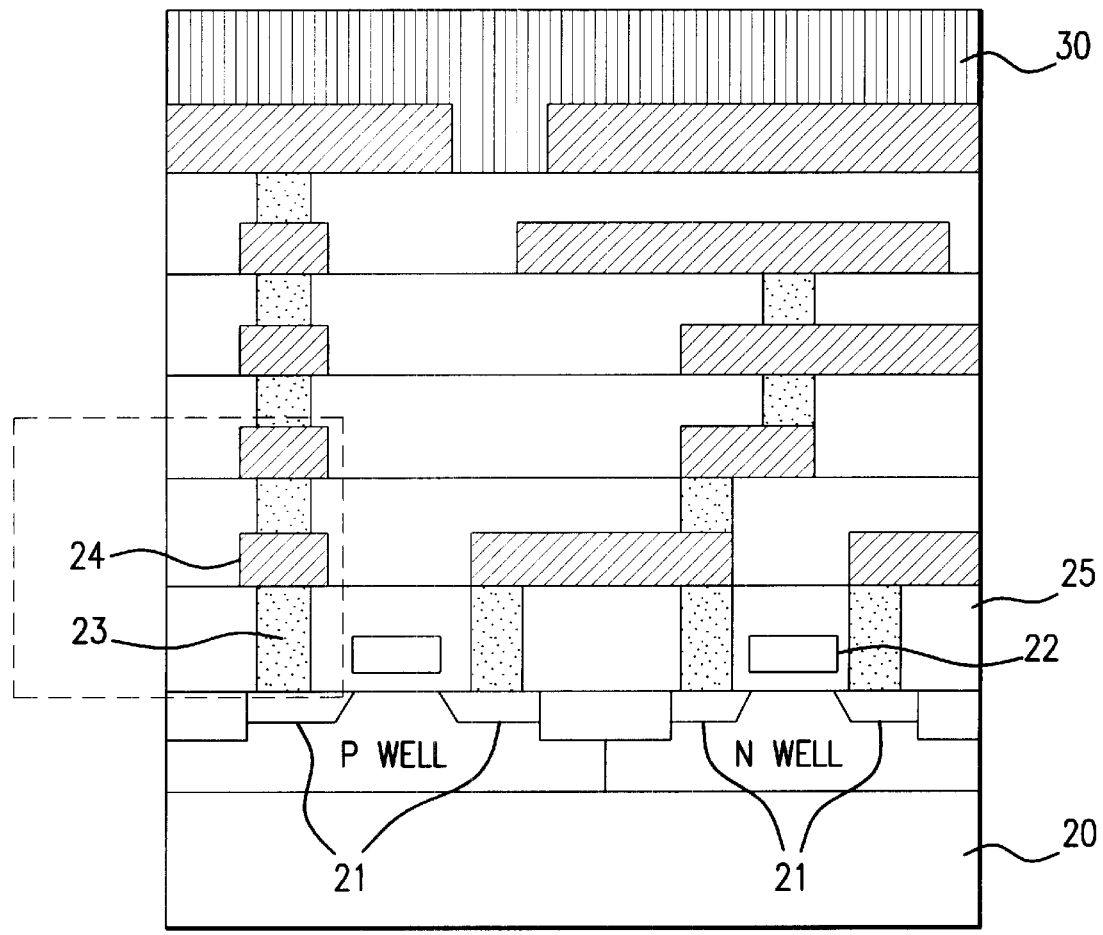
FIG. 6 is a schematic cross-sectional view showing a multi-layered copper interconnection structure.

FIG. 6 is a cross-sectional view showing an example of multi-layered structure in which layers of copper interconnection are laid. Upon a silicon substrate 20, there is formed a MOS (Metal-Oxide-Semiconductor) transistor comprising gate electrodes 22, diffusion layers 21 and so forth. An insulating film 25 is formed in such a way that this MOS transistor is buried therein. Within the insulating film 25, tungsten plugs 23 each connecting with a diffusion layer 21 are set, and, over those, copper interconnections 24 are formed. Above the layer that includes the copper interconnection 24, other copper interconnection layers with a similar structure are laid and, on the top of the layers, a passivation film 30 is set. Now, taking the structure shown in the section being enclosed with dotted lines in FIG. 6 as an example, the preferred embodiments of the present invention are described below.

Figure 1:
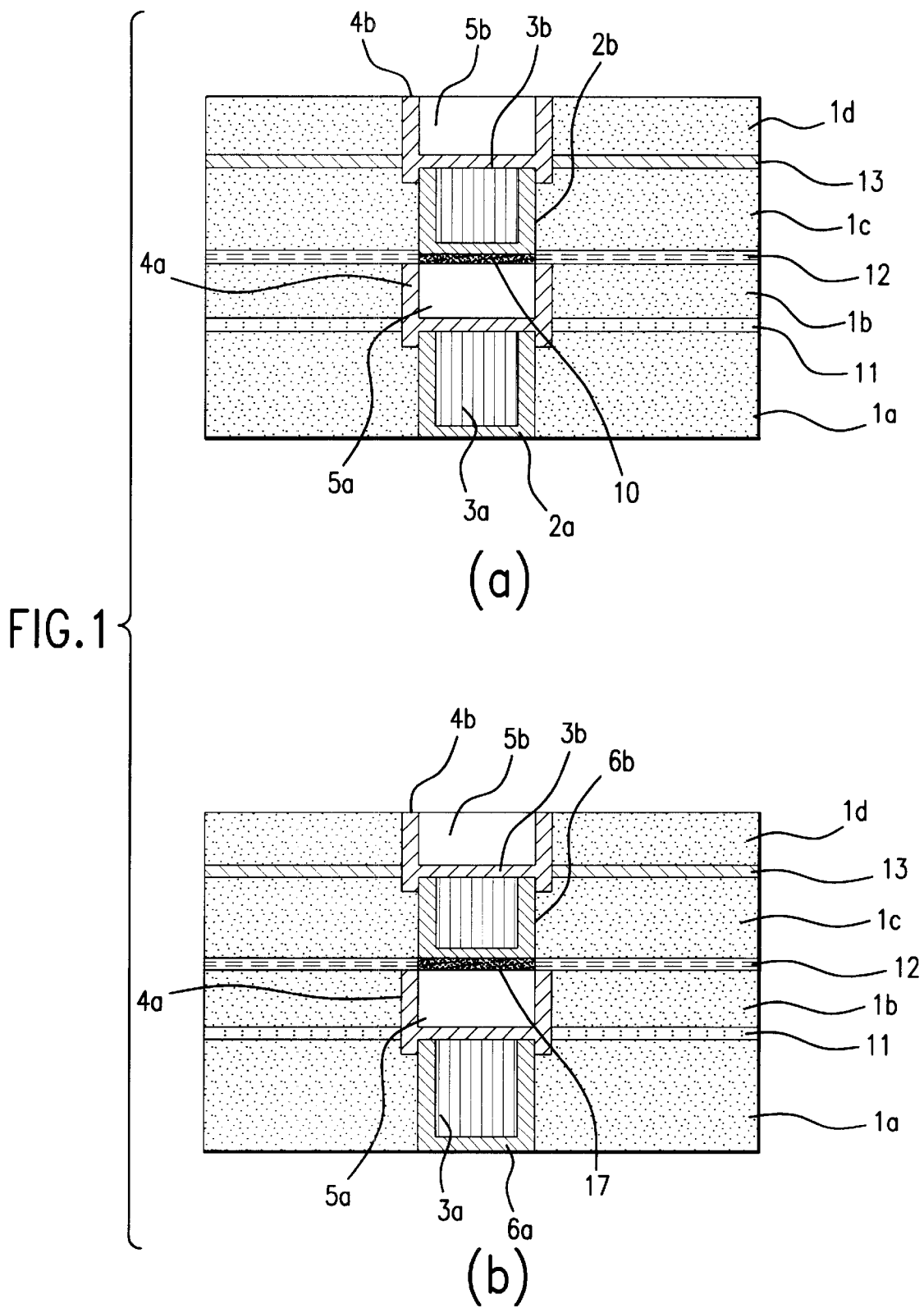
FIG. 1 is a pair of schematic cross-sectional views, each showing a semiconductor device in accordance with the present invention.
Figure 2:
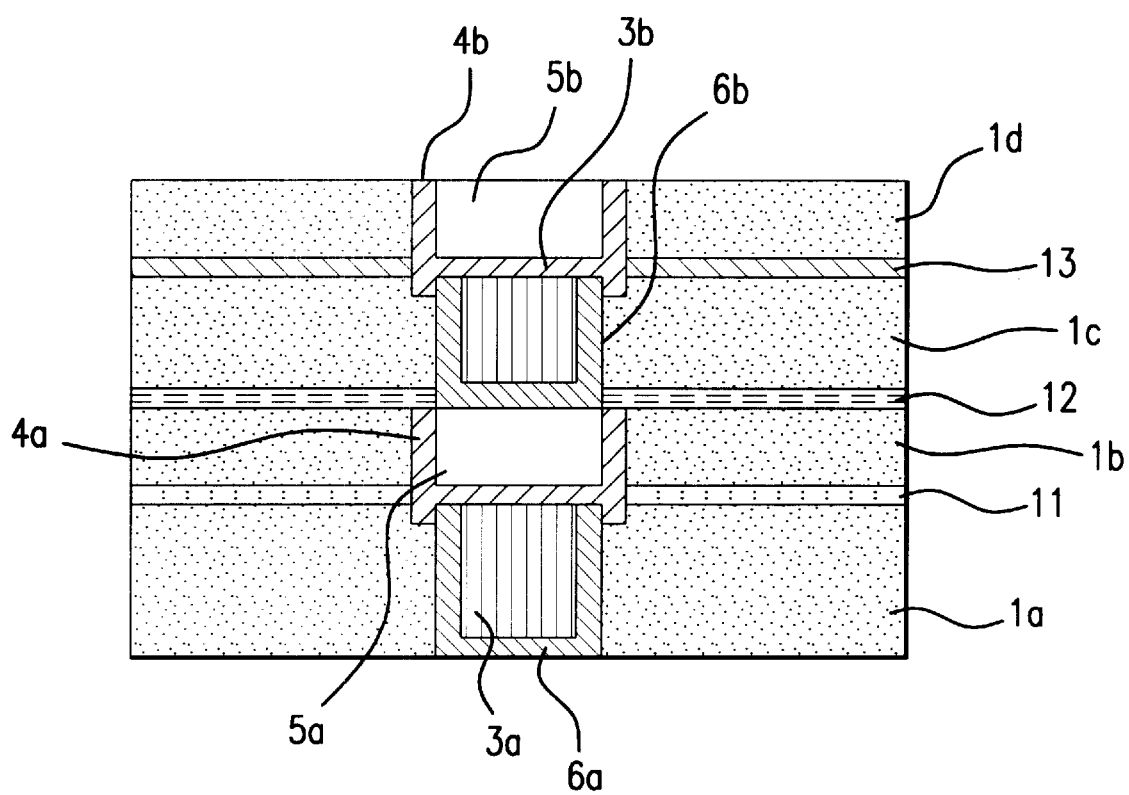
FIG. 2 is a schematic cross-sectional view showing a conventional semiconductor device.

FIG. 1 is a pair of cross-sectional views each showing the very structure presented in the section enclosed with dotted lines in FIG. 6 and an example illustrating the preferred embodiment of the present invention. FIG. 1(a) is an example wherein a tantalum-based material is employed as the material for the barrier metal film in a via plug. In the structure shown in the drawing, a silicon oxide film 1a, a silicon oxynitride film 11, a silicon oxide film 1b, a silicon oxynitride film 12, a silicon oxide film 1c, a silicon oxynitride film 13 and a silicon oxide film 1d are laid in this order on a semiconductor substrate that is omitted from the drawing. Within the silicon oxide film 1a, there is formed a contact plug connecting with a diffusion layer of the semiconductor substrate. The contact plug is composed of a tantalum-based barrier metal film 2a and a tungsten film 3a. Within the silicon oxide film 1b, a first copper interconnection connecting with the upper surface of the above-mentioned contact plug is formed. The first copper interconnection is composed of a tantalum-based barrier metal film 4a and a copper film 5a. Within the silicon oxide film 1c, there is formed an interlayer via plug connecting the upper surface of the first copper interconnection. The interlayer via plug is composed of a tantalum-based barrier metal film 2b and a tungsten film 3b. Within the silicon oxide film 1d, a second copper interconnection connecting with the upper surface of the interlayer through hole is formed. The second copper interconnection is composed of a tantalum-based barrier metal film 4b and a copper film 5b.

FIG. 1(b) is an example wherein a titanium-based material is employed as the material for the barrier metal film in a via plug. In the structure shown in the drawing, a silicon oxide film 1a, a silicon oxynitride film 11, a silicon oxide film 1b, a silicon oxynitride film 12, a silicon oxide film 1c, a silicon oxynitride film 13 and a silicon oxide film 1d are laid in this order on a semiconductor substrate that is omitted from the drawing. Within the silicon oxide film 1a, there is formed a contact plug connecting with a diffusion layer of the semiconductor substrate. The contact plug is composed of a barrier metal film 6a made of Ti/TiN and a tungsten film 3a. Within the silicon oxide film 1b, a first copper interconnection connecting with the upper surface of the above-mentioned contact plug is formed. The first copper interconnection is composed of a tantalum-based barrier metal film 4a and a copper film 5a. Within the silicon oxide film 1c, there is formed an interlayer via plug connecting the upper surface of the first copper interconnection. The interlayer via plug is composed of a titanium-based barrier metal film 6b and a tungsten film 3b. Within the silicon oxide film 1d, a second copper interconnection connecting with the upper surface of the interlayer through hole is formed. The second copper interconnection is composed of a tantalum-based barrier metal film 4b and a copper film 5b.

In the above examples, the lowest limit of the film thickness for either of the alloy layer 10 and the alloy layer 17 is preferably set not less than 1 nm. This ensures the alloy layer is formed as a continuous layer so that the electromigration resistance and the adhesion can be greatly improved and the contact resistance and the interconnection resistance, reduced. Further, while the upper limit of the film thickness for the either of the alloy layers is not specifically set, it is important to keep the structure in which the barrier metal film lies between the tungsten film 3b and the copper film 5a. In other words, it is essential that the tantalum-based barrier metal film 2b or the titanium-based barrier metal film 6b is not used up for the reaction of the alloy layer formation. Both examples in FIG. 1 take the form in which a barrier metal film lies between the tungsten film 3b and an alloy layer.

The film thickness of the first interconnection layer of the present invention or that of the copper film 5a of FIG. 1 is set preferably not greater than 350 nm and, more preferably not greater than 300 nm. Although there is no specific limitation for the lowest limit, it is set, for example, not less than 50 nm. When the interconnection layers are too thick, the parasitic capacitance between neighbouring interconnections becomes large and a cross talk may take place, making high-speed operations difficult to attain. Since the main purpose of using the copper interconnection is to achieve higher speed operations than those obtained with conventional aluminium interconnections, the film thickness thereof should be set preferably not greater than 350 nm and more preferably not greater than 300 nm, in order to keep such an advantage. On the other hand, when the copper interconnection becomes thin, the thickness of the corroded layer relative to that of the whole copper interconnection layer becomes large and the increase in interconnection resistance resulting from corrosion of the copper surface may cause concern. In the present invention, however, such corrosion is prevented with effect and, therefore, by reducing the film thickness of the copper interconnections, high-speed operations can be achieved and besides the problem of the increase in interconnection resistance as described above can be overcome readily.

EXAMPLE 1

Figure 3:
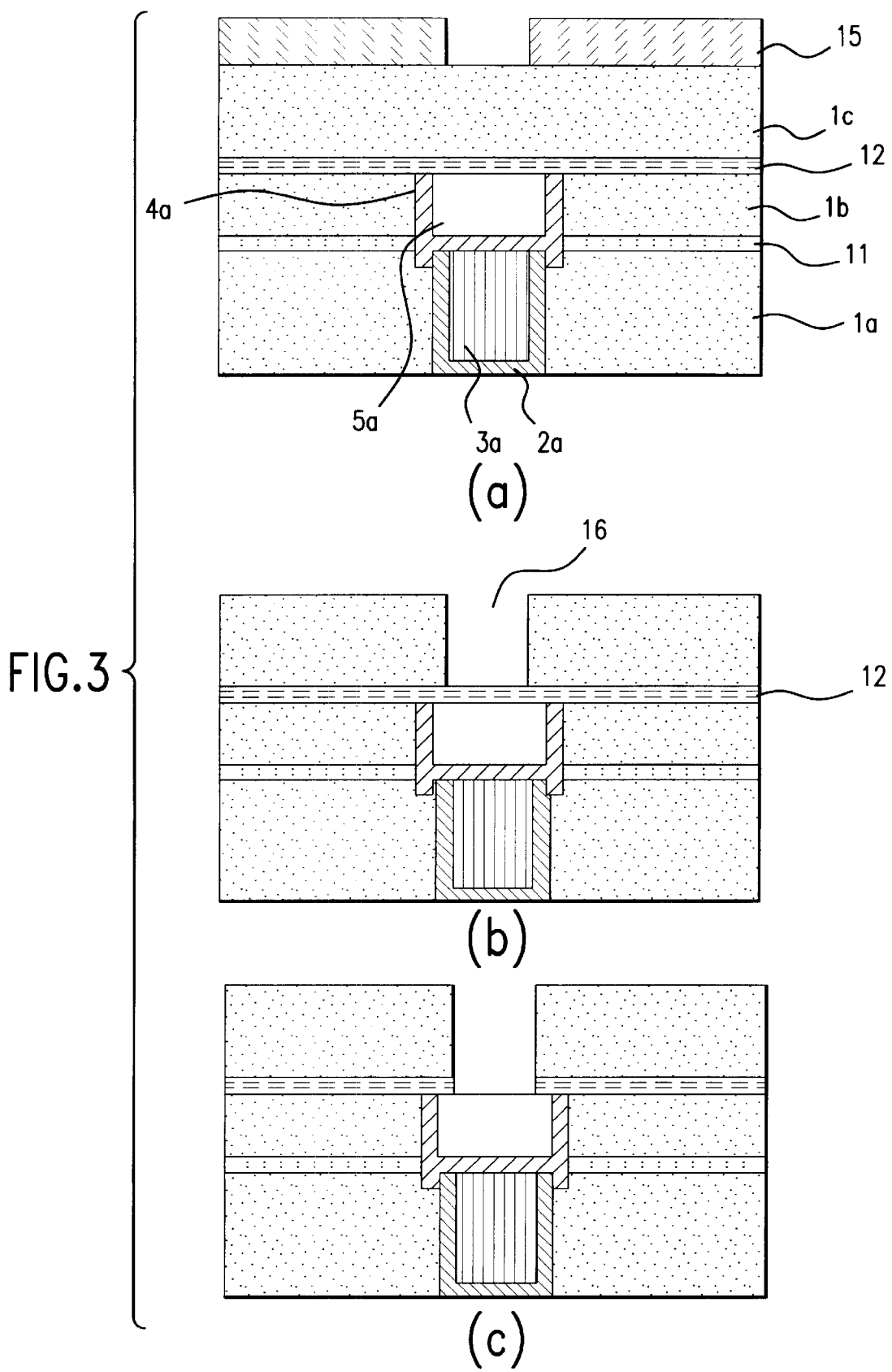
FIG. 3 is a series of schematic cross-sectional views illustrating the steps of a method of manufacturing a semiconductor device in accordance with the present invention.
Figure 4:
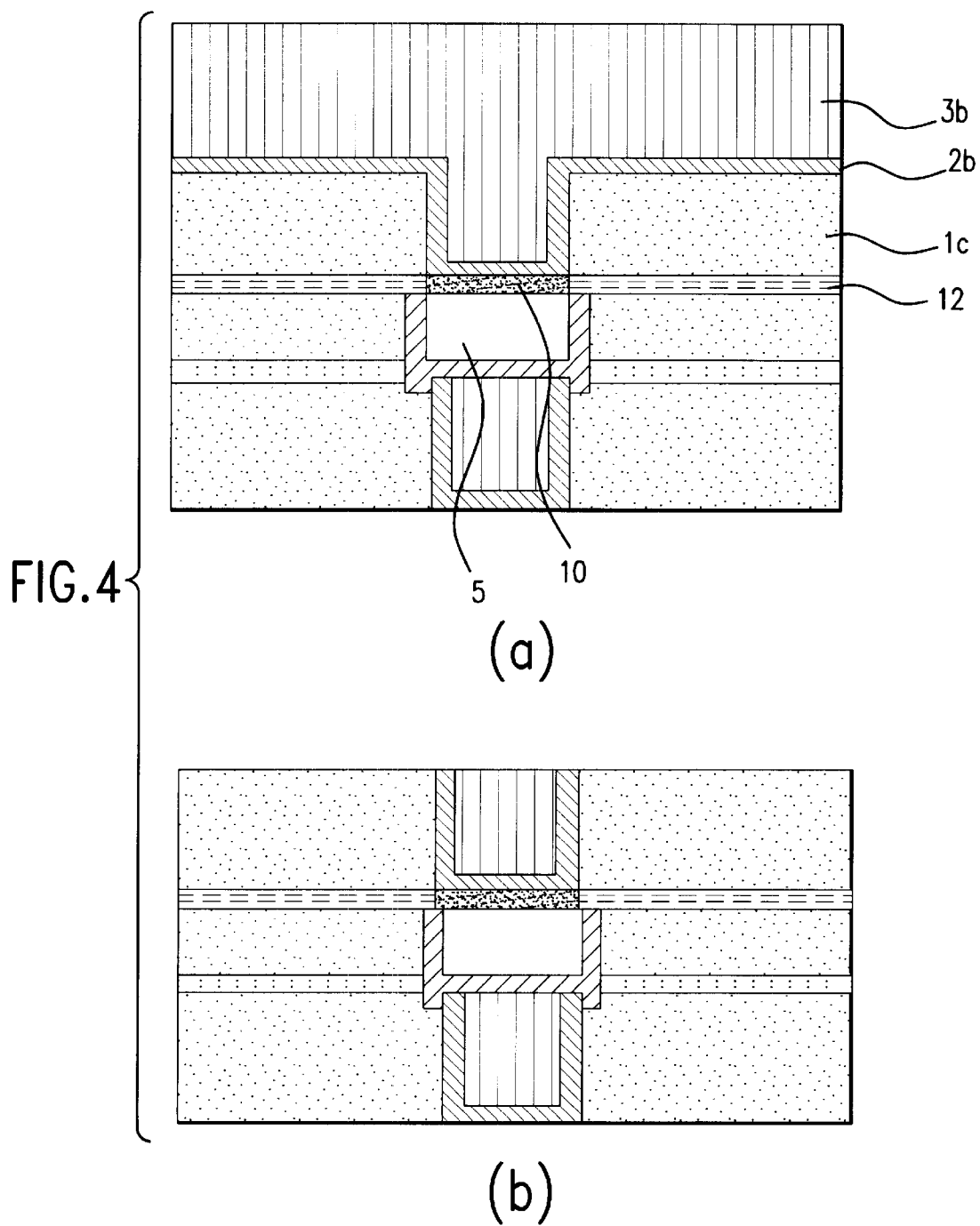
FIG. 4 is a series of schematic cross-sectional views illustrating further steps of the method of manufacturing a semiconductor device in accordance with the present invention.
Figure 5:
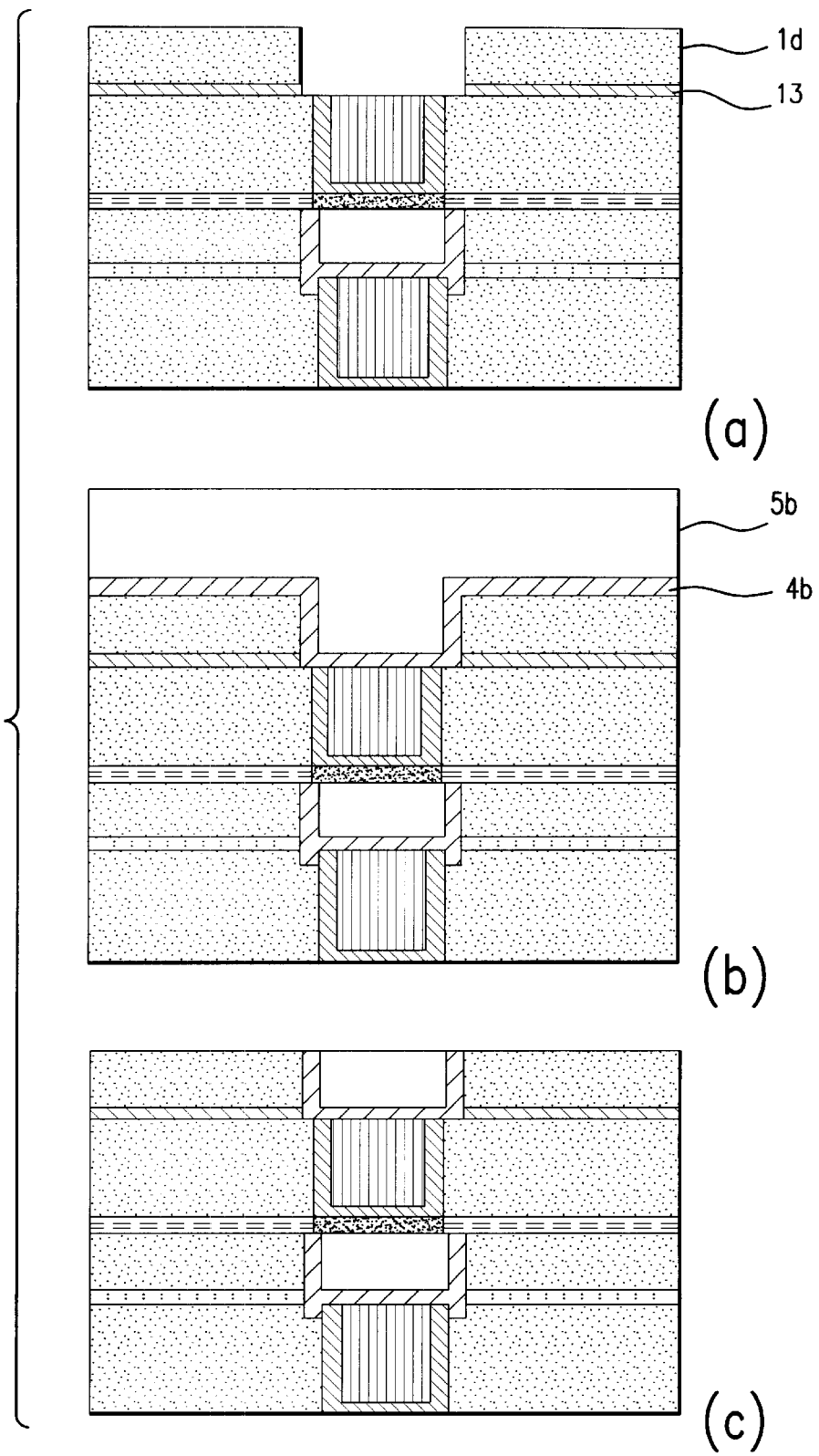
FIG. 5 is a series of schematic cross-sectional views illustrating further steps of the method of manufacturing a semiconductor device in accordance with the present invention.

The present example is an example wherein a tantalum-based material is employed as the material for the barrier metal film in a via plug. Referring to FIGS. 3 to 5, a manufacturing method of the interconnection structure of FIG. 1(a) is described below.

FIG. 3(a) is a cross-sectional view illustrating the step of the manufacturing method at a stage where formation of a contact plug and a copper interconnection has completed. The steps which bring the state of FIG. 3(a) is first described. Firstly, after a silicon oxide film 1a was grown on a silicon substrate (not shown in the drawing) where elements such as a transistor were formed, a contact hole was formed by dry etching, and then a tantalum-based barrier metal film 2a and a tungsten film 3a were formed in this order so as to fill up the inside of the hole. Subsequent planarization was carried out by the CMP and thereby formation of a tungsten plug was accomplished. Next, after growing a silicon oxynitride film 11 and a silicon oxide film 1b, an interconnection trench was formed, and then a tantalum-based barrier metal film 4a (with a film thickness of 15 nm) for which layers of Ta and TaN were laid in this order and a copper film 5a (with a film thickness of 300 nm) are formed in this order so as to fill up the inside of the trench. Subsequent planarization by the CMP accomplished formation of a copper interconnection. Next, after a silicon oxynitride film 12 (with a film thickness of 50 nm) and a silicon oxide film 1c (with a film thickness of 700 nm) were grown, a resist film 15 patterned into a prescribed shape was formed thereon, and, thus, the state of FIG. 3(a) was attained.

Subsequently, dry etching with a fluorocarbon-based gas was carried out till the silicon oxynitride film 12 was exposed and a through hole was formed, as shown in FIG. 3 (b). The bore of the hole was set to be approximately 0.2 μm. Next, by means of oxygen plasma ashing, the resist film 15 was removed, and thereafter the resist residue was removed by a wet treatment, using a resist stripper agent containing amine.

Next, using a different etching gas from the one in the above etching, the silicon oxynitride film 12 was etched so that the upper surface of the copper film 5a was exposed (FIG. 3(c)). Next, the resist residue was removed by a wet treatment, using a resist stripper agent containing amine.

Next, a tantalum-based barrier metal film 2b (with a film thickness of 15 nm in the flat section) of tantalum nitride was formed over the entire surface of the substrate by the reactive sputtering method.

Subsequently, tungsten microcrystallines that are to act as nuclei in growing a bulk tungsten film (a blanket tungsten film) were thinly grown on the surface inside of the hole by the low pressure CVD (Chemical Vapour Deposition) method. In this instance, the growth gas utilized was a mixed gas of $WF_6$, $SiH_4$ and Ar, and the deposition temperature (substrate temperature) was set at about 420° C.

When a tungsten film was grown to a thickness of about 50 nm under these conditions, the supply of the gas was once stopped, and thereby the step of forming growth nuclei terminated.

Following that, with $WF_6$ and $H_2$ being supplied to the deposition chamber, a bulk tungsten film was grown to fill up the inside of the hole. This reaction was made under the $H_2$ reducing condition where the growth rate of the film is faster than that in the step of growing nuclei. In this instance, the growth gas utilized was a mixed gas of $WF_6$, $H_2$ and Ar, and the deposition temperature (substrate temperature) was set at about 460° C.

In this manner, the formation of the tungsten film 3b was accomplished. The film thickness thereof was set to be 400 nm. FIG. 4(a) shows the state, thereof after the steps described so far have been completed.

Next, unnecessary portions of the tungsten film 3b and the tantalum-based barrier metal film 2b that were grown outside of the through hole were removed by the CMP so that the tungsten film 3b and the barrier metal film 2b might be left only inside of the hole (FIG. 4(b)).

Next, after growing a silicon oxynitride film 13 and a silicon oxide film 1d, an interconnection trench was formed by dry etching (FIG. 5(a)) and, then, a tantalum-based barrier metal film 4b for which layers of Ta and TaN were laid in this order and a copper film 5b were formed in this order so as to fill up the inside of the trench (FIG. 5(b)). Subsequent planarization by the CMP accomplished formation of a copper interconnection (FIG. 5(c)).

Formation of a multi-layered interconnection structure with double-layered copper interconnections was thereby accomplished. The copper interconnections can be made to have three layers or more by carrying out the steps described above repeatedly.

After forming a double-layered interconnection structure following the steps of the manufacturing method described above, cross-sections of the structure were observed by a SEM (Scanning Electron Microscope) and, then, elementary analysis was conducted for them. A cross-sectional SEM micrograph obtained thereat is shown in FIG. 16.

Figure 16:
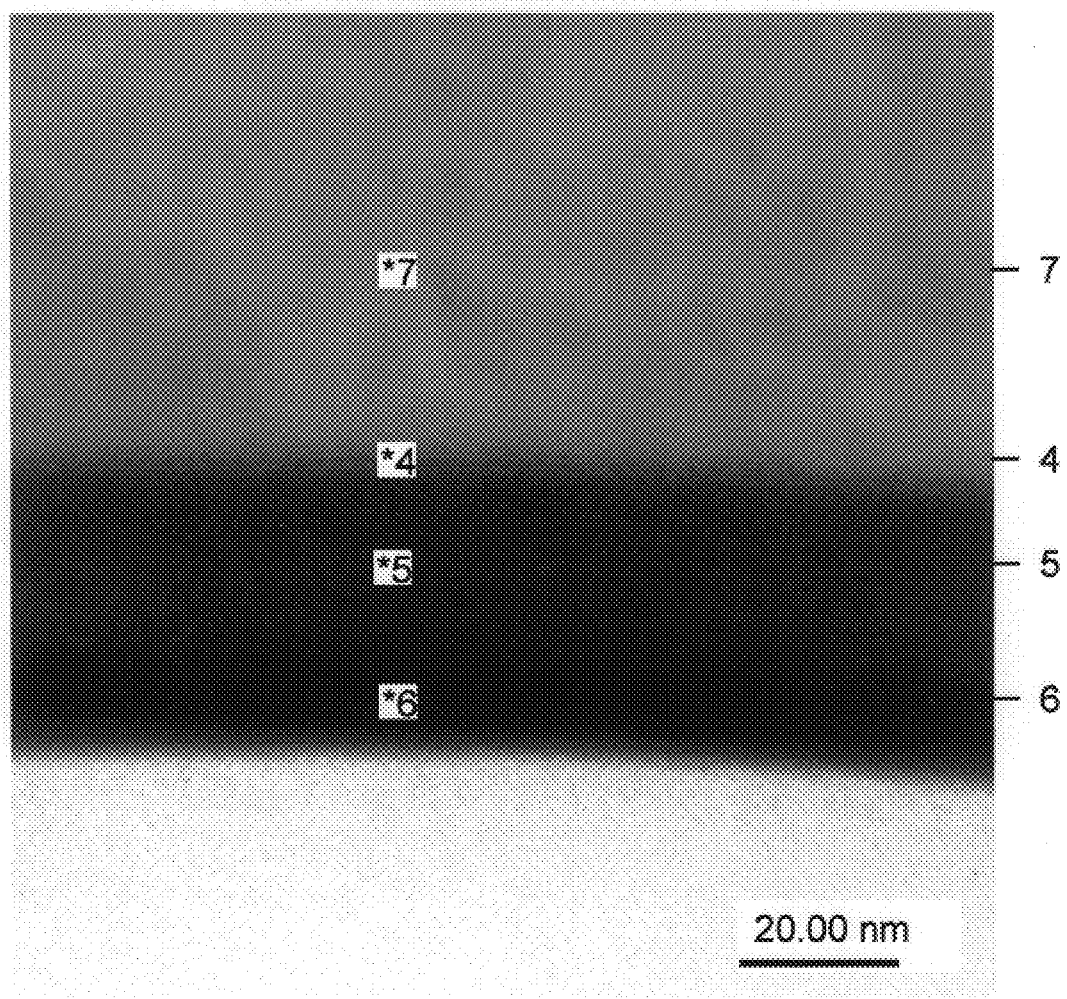
FIG. 16 is an electron micrograph showing the presence of an alloy layer on the interface between the copper film and the barrier metal film.

In FIG. 16, Layer 7 corresponds to the copper film 5a of FIG. 1(a); Layer 6, the tantalum-based barrier metal film 2b; and Layer 4 and Layer 5, the alloy layer 10 made through the reaction with copper and tantalum.

Figure 17:
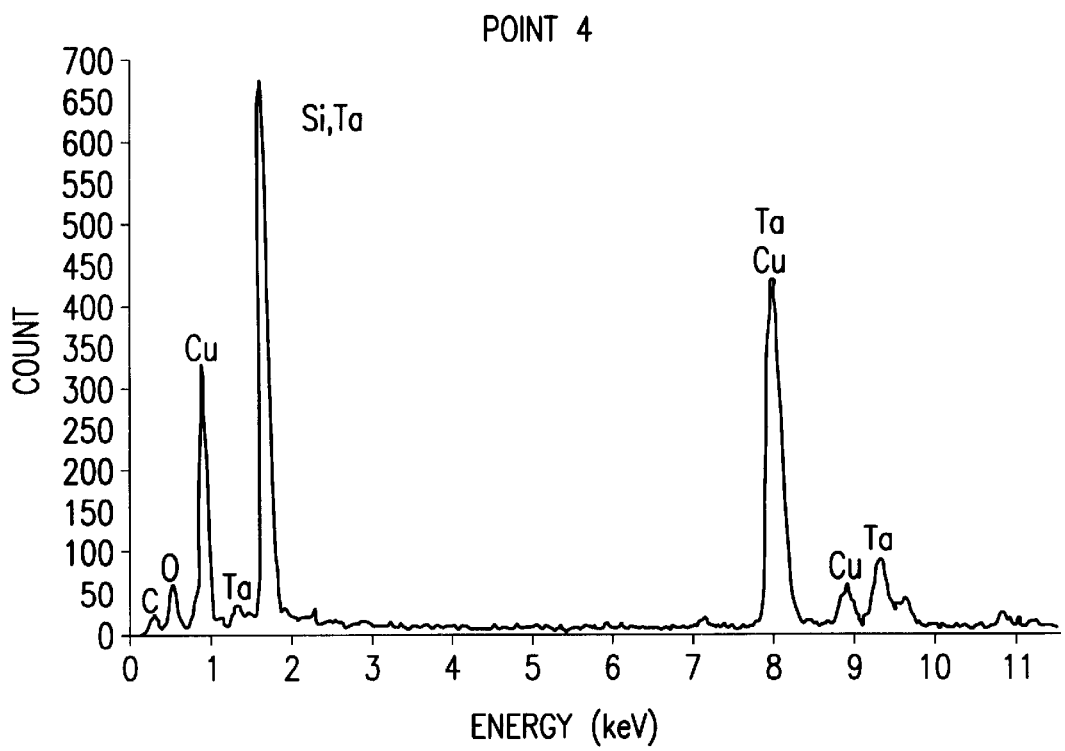
FIG. 17 is a spectrum showing the result of X-ray fluorescence analysis conducted for the interface between the copper film and the barrier metal film.
Figure 18:
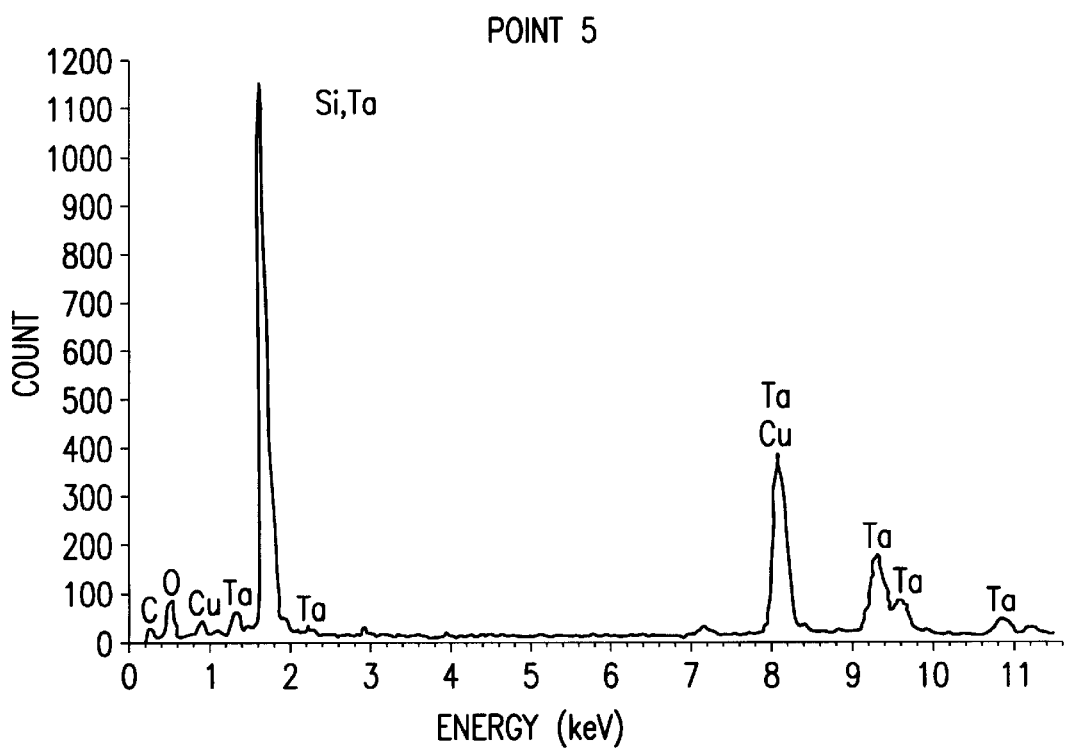
FIG. 18 is another spectrum showing the result of X-ray fluorescence analysis conducted for the interface between the copper film and the barrier metal film.
Figure 19:
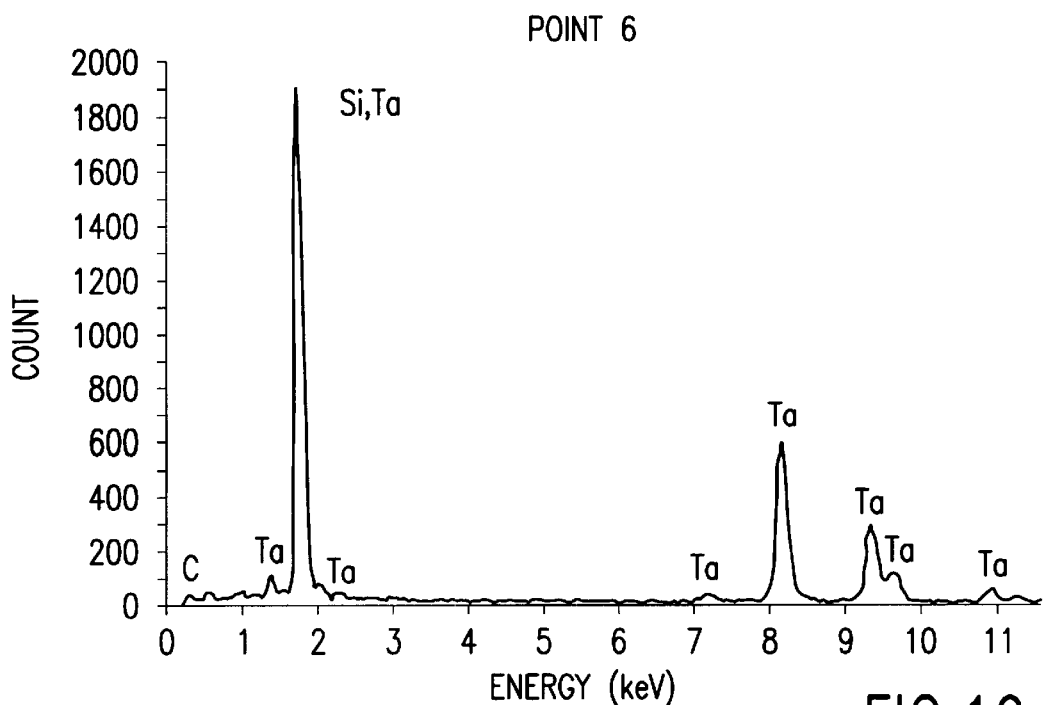
FIG. 19 is another spectrum showing the result of X-ray fluorescence analysis conducted for the interface between the copper film and the barrier metal film.

Further, results of elementary analysis for *4 to *7 (Points 4 to 7) obtained using X-ray fluorescence are presented in FIGS. 17 to 20. FIG. 17 shows the result of analysis for *4 (Point 4); FIG. 18, for *5 (Point 5); FIG. 19, for *6 (Point 6) and FIG. 20, for *7 (Point 7). The results of analysis for respective points are summarized in Table 1.

TABLE 1

Figure 20:
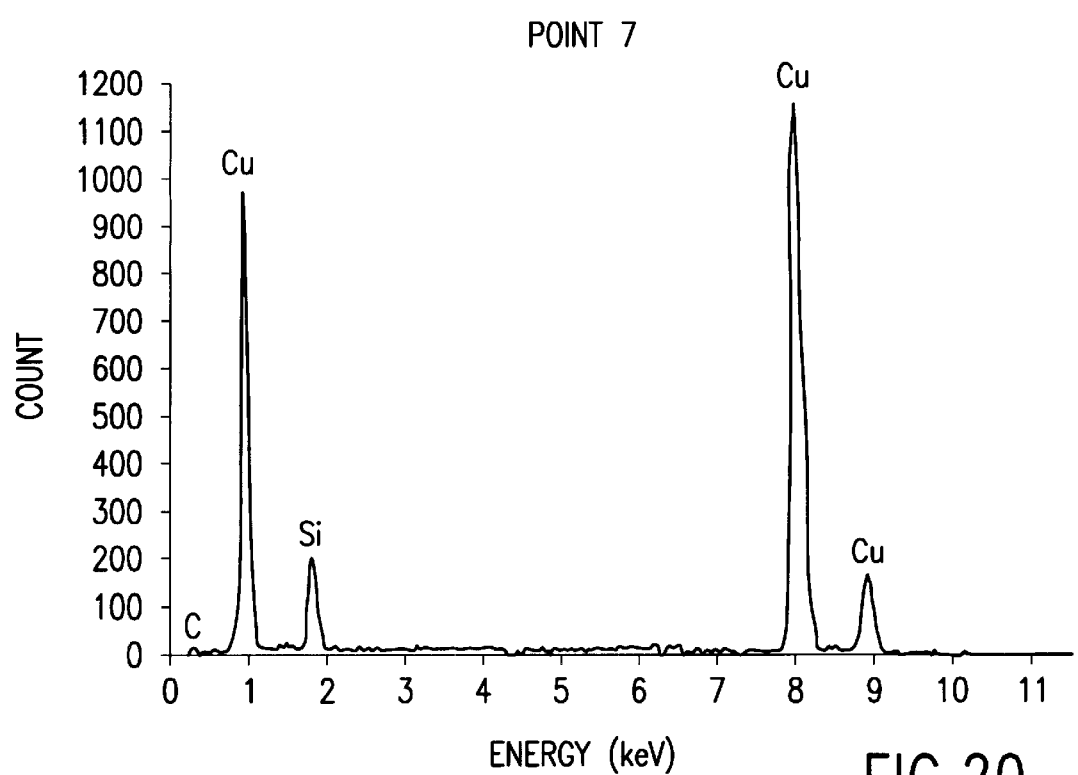
FIG. 20 is another spectrum showing the result of X-ray fluorescence analysis conducted for the interface between the copper film and the barrier metal film.

| Fig. No. | Point No. | Detected Peak | Specification of Layer |
| --- | --- | --- | --- |
| FIG. 17 | Point 4 | Cu, Ta | Alloy layer (Alloy layer 10 of FIG. 1(a)) |
| FIG. 18 | Point 5 | Cu, Ta | Alloy Layer (Alloy layer 10 of FIG. 1(a)) |
| FIG. 19 | Point 6 | Ta | TaN layer (Tantalum-based barrier metal film 2b of FIG. 1(a)) |
| FIG. 20 | Point 7 | Cu | Cu layer (Copper film 5a of FIG. 1(a)) |

The above results clearly indicate that, in the interconnection structure manufactured in the present example, (i) between the TaN layer and the Cu layer, an alloy layer made through the reaction of these two layers is indeed formed; and (ii) without being used up for the reaction of the alloy layer formation, the TaN layer still remains. In other words, the interconnection structure of the present example is formed as a layered assembly in which a layer of copper-based metal, an alloy layer and a barrier metal film are laid in this order.

EXAMPLE 2

A multi-layered interconnection structure having quadruple-layered copper interconnections was formed, following the same steps as in Example 1, except that the barrier metal film 2b was replaced with a layered film in which tantalum and tantalum nitride were laid in this order. The film thicknesses of both of these layers of tantalum and tantalum nitride in the flat section (the section lying on the substrate surface outside of the hole) were set to be 10 nm. The multi-layered interconnection structure obtained in this example is excellent in electromigration resistance and free from the problem of film detachment or the like.

EXAMPLE 3

Figure 7:
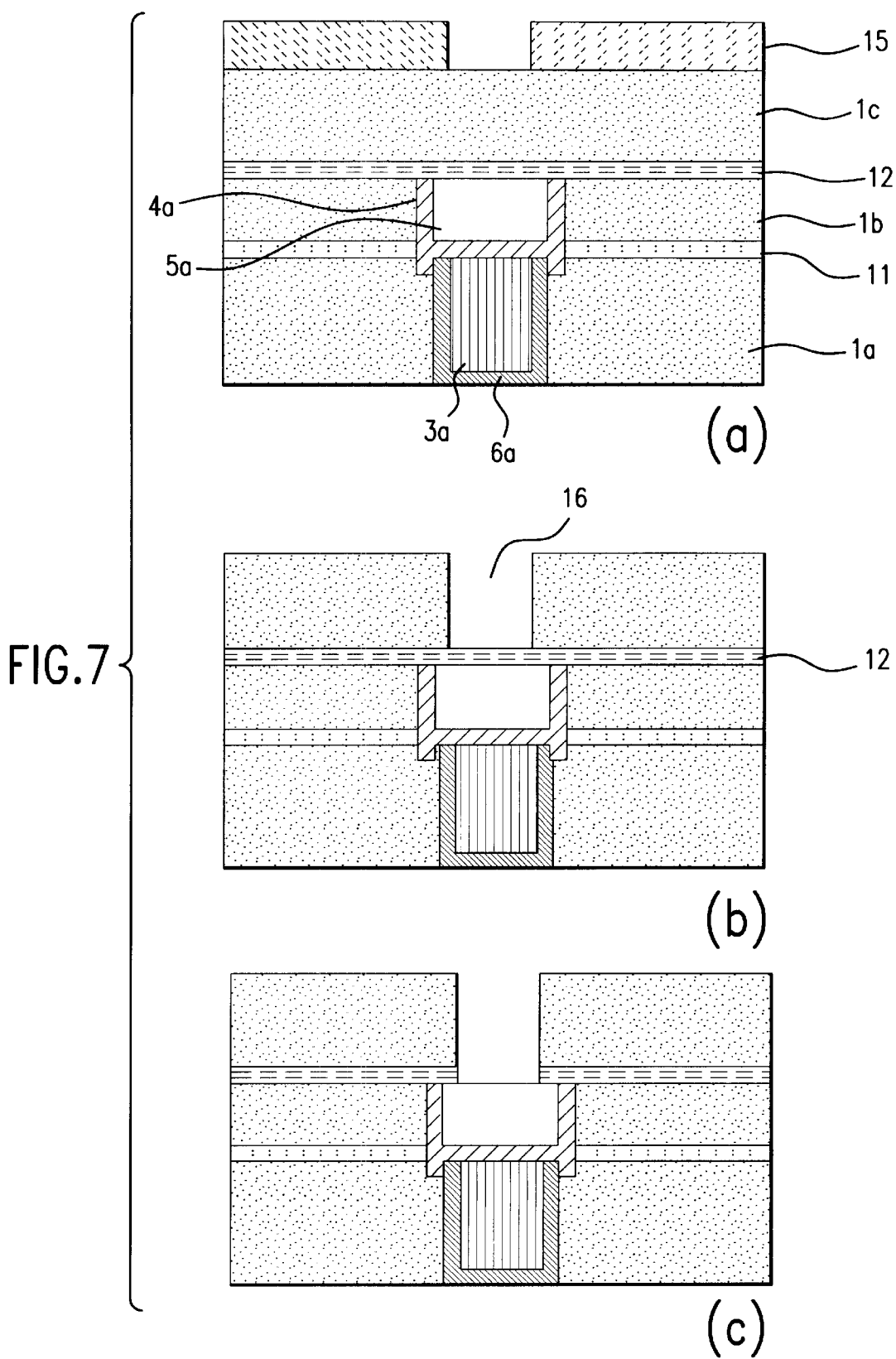
FIG. 7 is a series of schematic cross-sectional views illustrating the steps of another method of manufacturing a semiconductor device in accordance with the present invention.
Figure 8:
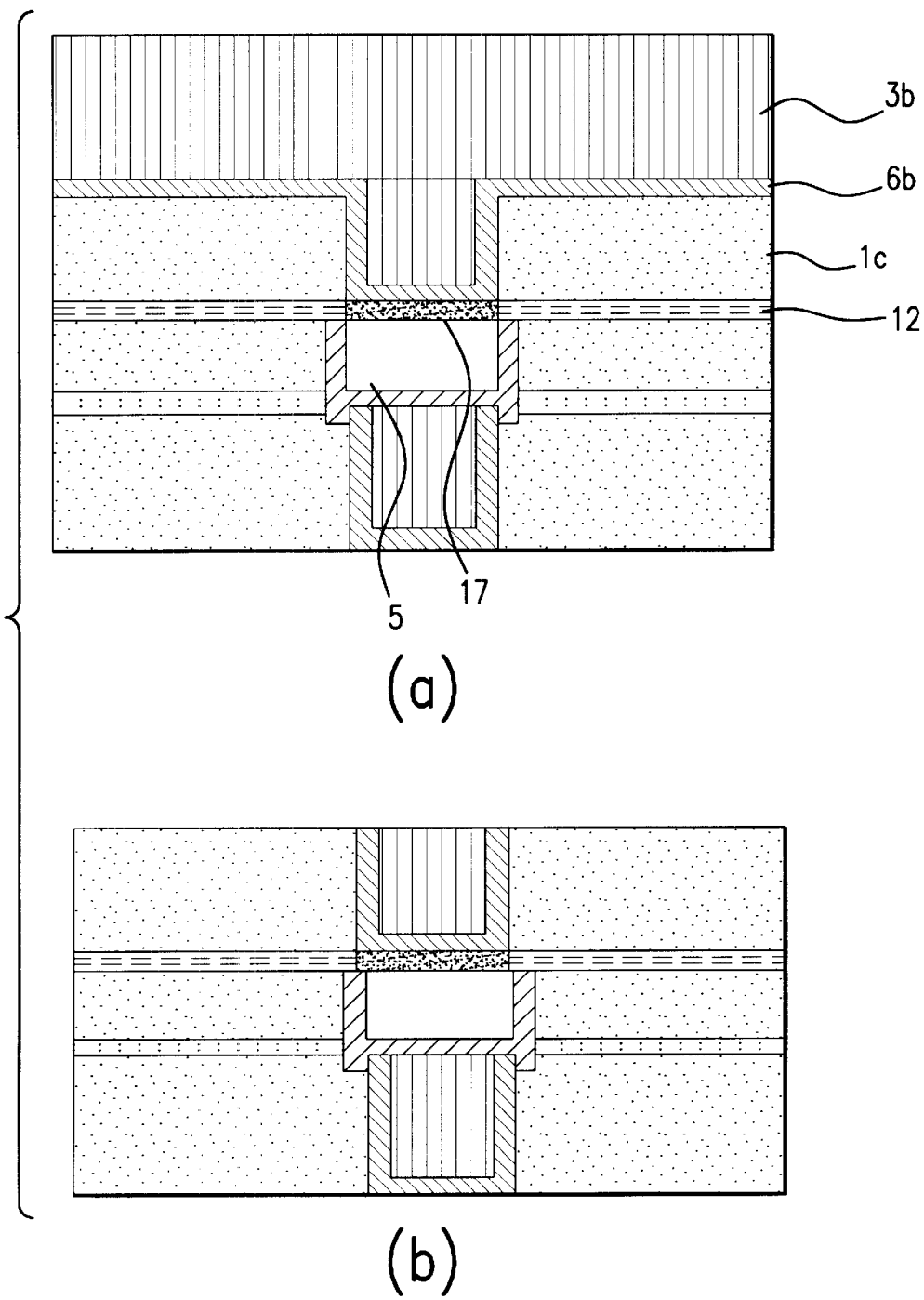
FIG. 8 is a series of schematic cross-sectional views illustrating further steps of the method of manufacturing a semiconductor device in accordance with the present invention.
Figure 9:
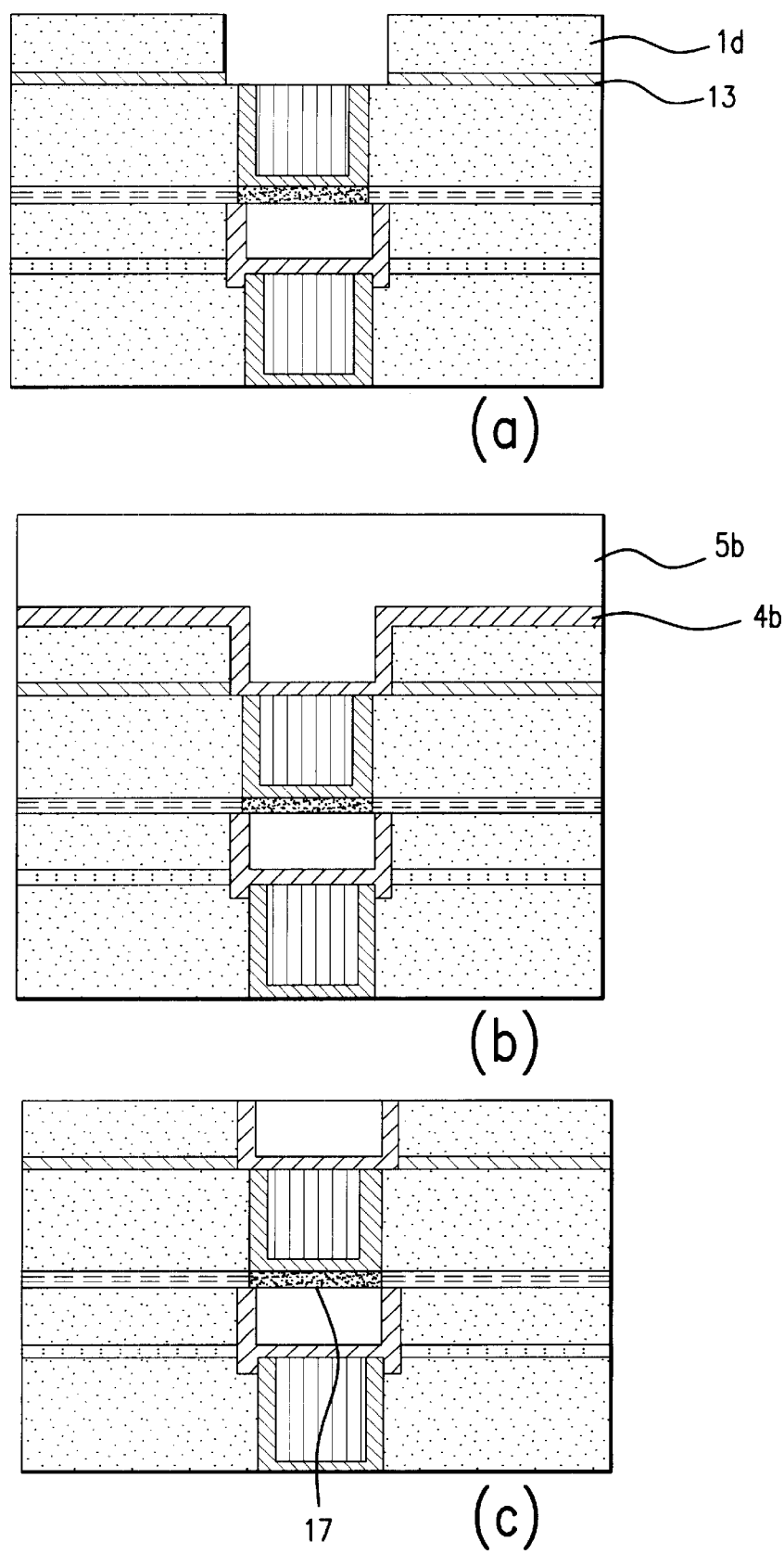
FIG. 9 is a series of schematic cross-sectional views illustrating further steps of the method of manufacturing a semiconductor device in accordance with the present invention.
Figure 10:
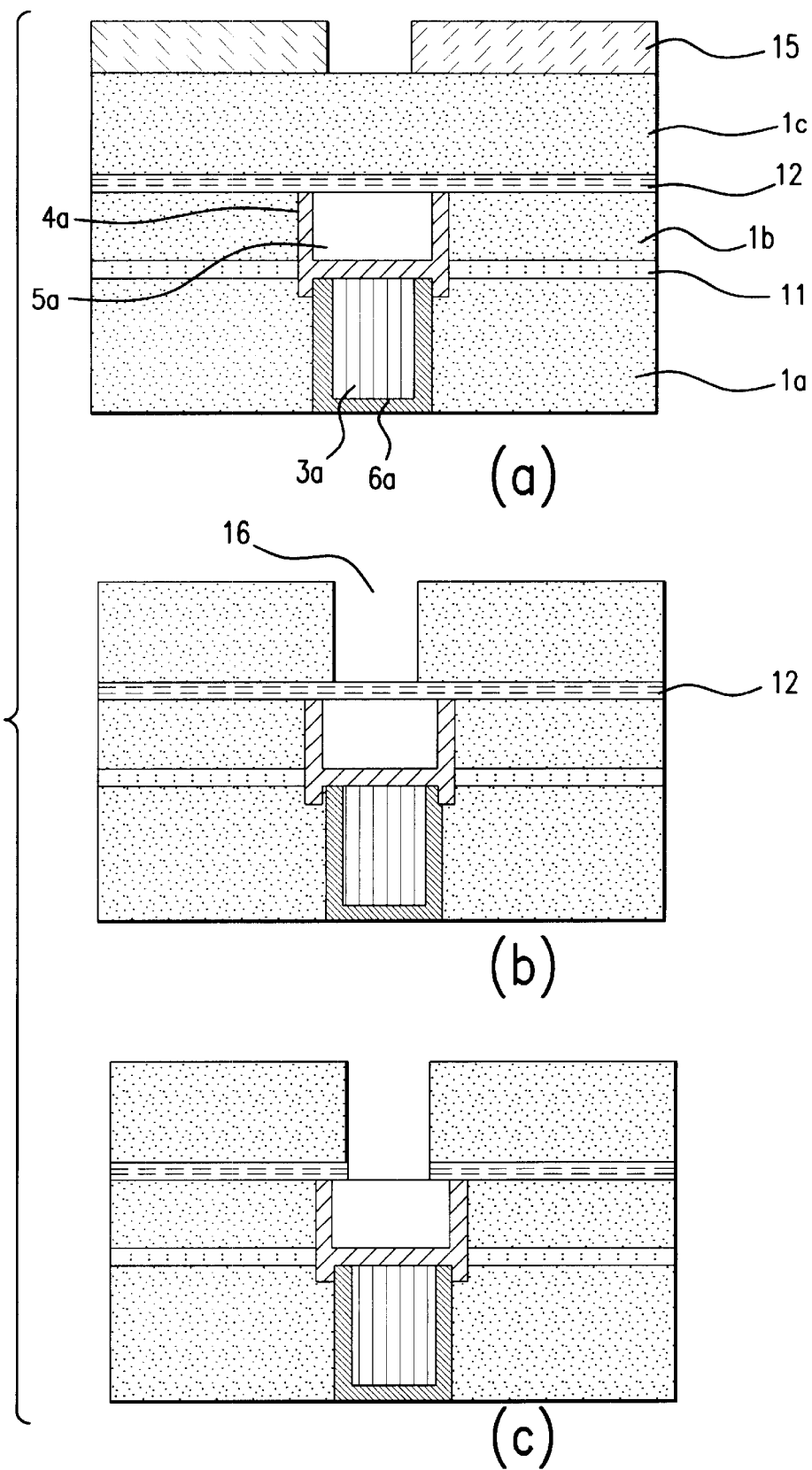
FIG. 10 is a series of schematic cross-sectional views illustrating the steps of a conventional method of manufacturing a semiconductor device.
Figure 11:
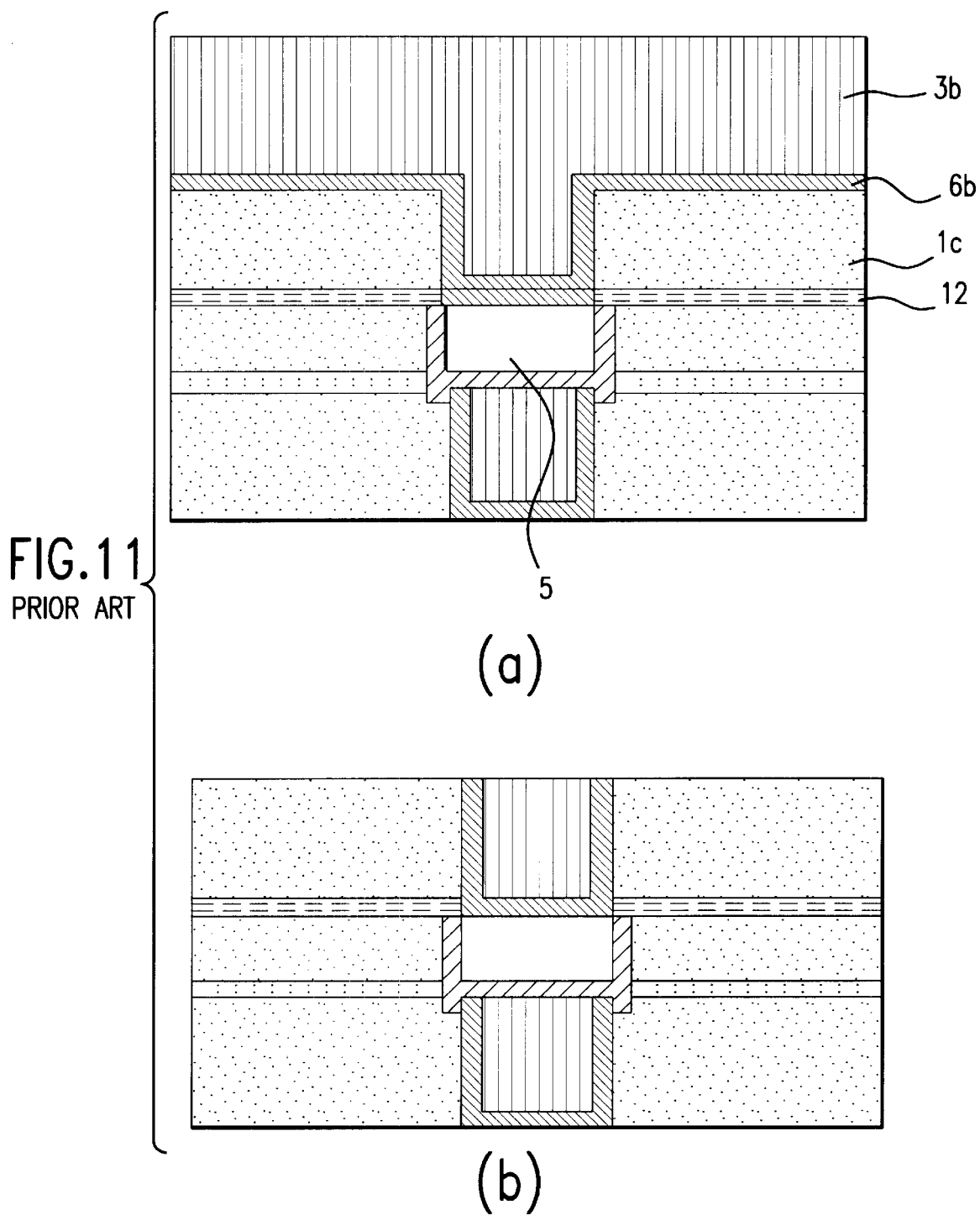
FIG. 11 is a series of schematic cross-sectional views illustrating further steps of the conventional method of manufacturing a semiconductor device.
Figure 12:
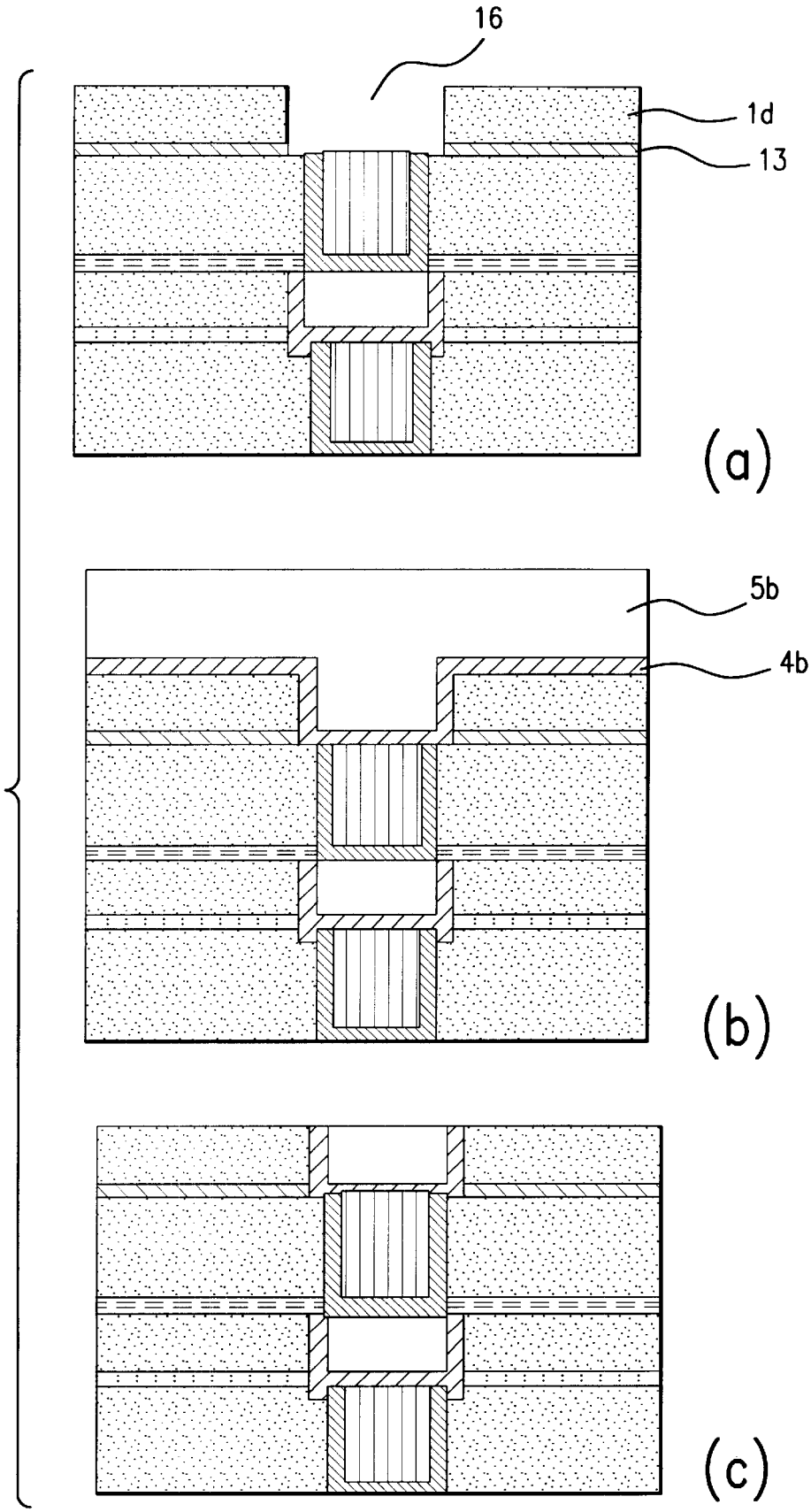
FIG. 12 is a series of schematic cross-sectional views illustrating further steps of the conventional method of manufacturing a semiconductor device.
Figure 13:
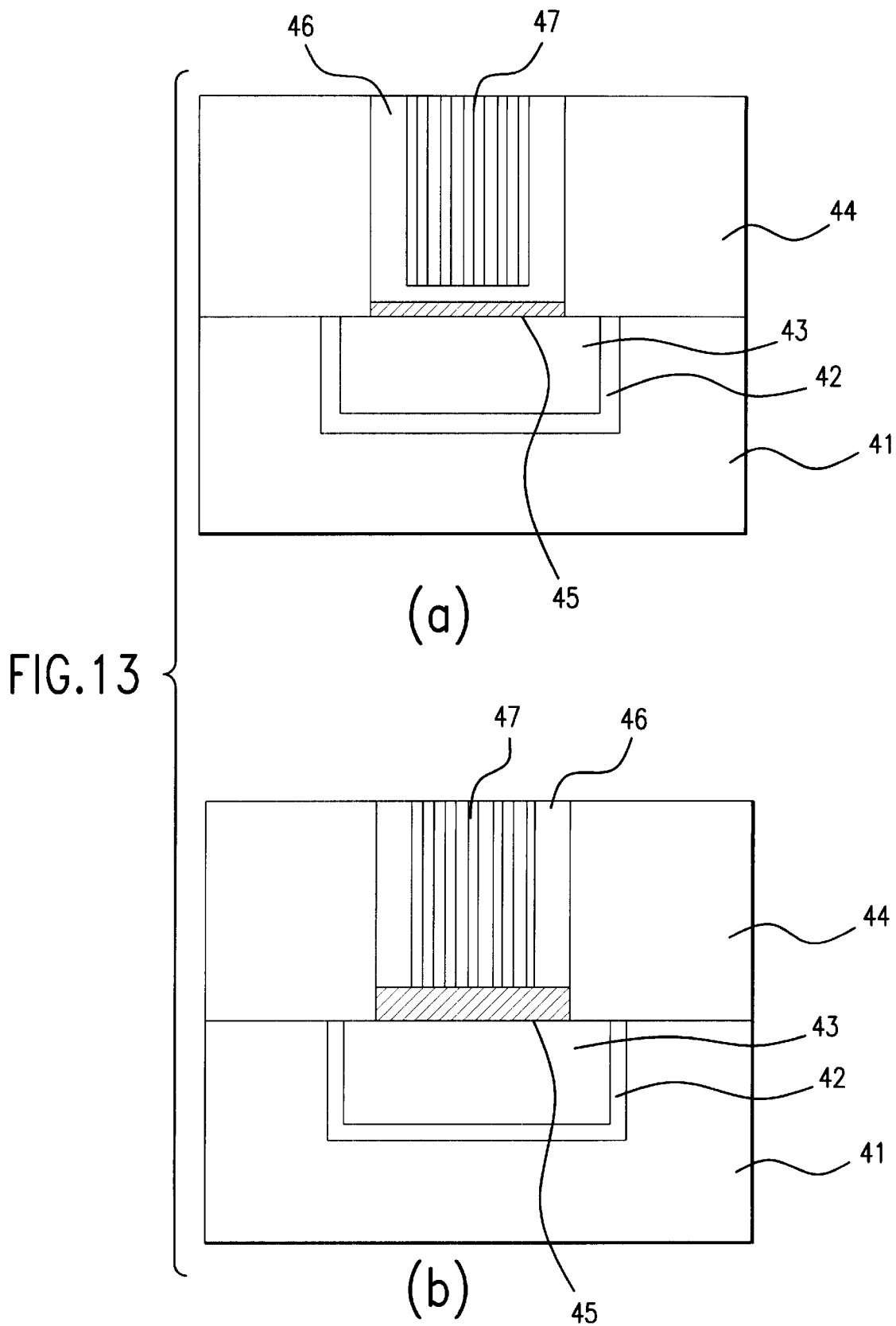
FIG. 13 is a pair of schematic cross-sectional views in explaining the form of the alloy layer.

The present example is an example wherein a titanium-based material is employed as the material for the barrier metal film in a via plug. Referring to FIGS. 7 to 9, a manufacturing method of the interconnection structure of FIG. 1(b) is described below.

FIG. 7(a) is a cross-sectional view illustrating the step of the manufacturing method at a stage where formation of a contact plug and a copper interconnection has completed. The steps which bring the state of FIG. 7(a) are first described. Firstly, after a silicon oxide film 1a was grown on a silicon substrate (not shown in the drawing) where elements such as a transistor were formed, a contact hole was formed by dry etching, and then a barrier metal film 6a and a tungsten film 3a were formed in this order so as to fill up the inside of the hole. Subsequent planarization was carried out by the CMP and thereby formation of a tungsten plug was accomplished. Next, after growing a silicon oxynitride film 11 and a silicon oxide film 1b, an interconnection trench was formed, and then a tantalum-based barrier metal film 4a for which layers of Ta and TaN were laid in this order and a copper film 5a are formed in this order so as to fill up the inside of the trench. Subsequent planarization by the CMP accomplished formation of a copper interconnection. Next, after a silicon oxynitride film 12 and a silicon oxide film 1c were grown, a resist film 15 patterned into a prescribed shape was formed thereon, and, thus, the state of FIG. 7(a) was attained.

Subsequently, dry etching with a fluorocarbon-based gas was carried out till the silicon oxynitride film 12 was exposed and a through hole was formed, as shown in FIG. 7(b). The bore of the hole was set to be approximately 0.2 μm. Next, by means of oxygen plasma ashing, the resist film 15 was removed, and thereafter the resist residue was removed by a wet treatment, using a resist stripper agent containing amine.

Next, using a different etching gas from the one in the above etching, the silicon oxynitride film 12 was etched so that the upper surface of the copper film 5a was exposed (FIG. 7(c)). Next, the resist residue was removed by a wet treatment, using a resist stripper agent containing amine.

Next, a titanium-based layered barrier metal film 6b (with a film thickness of 15 nm in the flat section) of titanium/titanium nitride was formed over the entire surface of the substrate by the reactive sputtering method.

Subsequently, tungsten microcrystallines which are to act as nuclei in growing a bulk tungsten film (a blanket tungsten film) were thinly grown on the surface inside of the hole by the low pressure CVD method. In this instance, the growth gas utilized was a mixed gas of $WF_6$, $SiH_4$ and Ar, and the deposition temperature (substrate temperature) was set at about 380° C.

When a tungsten film was grown to a thickness of about 50 nm under these conditions, the supply of the gas was once stopped, and thereby the step of forming growth nuclei terminated.

Following that, with $WF_6$ and $H_2$ being supplied to the deposition chamber, a bulk tungsten film was grown to fill up the inside of the hole. This reaction was made under the $H_2$ reducing condition where the growth rate of the film is faster than that in the step of growing nuclei. In this instance, the growth gas utilized was a mixed gas of $WF_6$, $SiH_4$ and Ar, and the deposition temperature (substrate temperature) was set at about 380° C.

In this manner, the formation of the tungsten film 3b was accomplished. FIG. 8(a) shows the state thereof after the steps described so far have been completed.

Next, unnecessary portions of the tungsten film 3b and the titanium-based barrier metal film 6b that were grown outside of the through hole were removed by the CMP so that the tungsten film 3b and the barrier metal film 6b might be left only inside of the hole (FIG. 8(b)).

Next, after growing a silicon oxynitride film 13 and a silicon oxide film 1d, an interconnection trench was formed by dry etching (FIG. 9(a)) and, then, a tantalum-based barrier metal film 4b for which layers of Ta and TaN were laid in this order and a copper film 5b were formed in this order so as to fill up the inside of the trench (FIG. 9(b)). Subsequent planarization by the CMP accomplished formation of a copper interconnection (FIG. 9(c)).

Formation of a multi-layered interconnection structure with double-layered copper interconnections was thereby accomplished. Subsequently, by carrying out the steps described above repeatedly, a multi-layered interconnection structure having five-layered copper interconnections was obtained. The multi-layered interconnection structure obtained in this example is excellent in electromigration resistance and free from the problem of film detachment or the like.

In the above Examples, the barrier metal film for the tungsten via plug was formed by the isotropic sputtering method, but the anisotropic sputtering method can be also utilized. This latter method provides an additional advantage that the thinning of the barrier metal film at the bottom of the through hole can be prevented and, thus, the unreacted layer of the barrier metal film can be left in a favourable way.

With miniaturization of the elements, the diameter of the through hole becomes smaller, and, for example, when the diameter of the hole becomes 0.18 μm or less, the film thickness of the barrier metal film must be also reduced. Besides, the barrier metal film at the bottom of the hole generally becomes thinner than that in the flat section. Meanwhile, in order to leave the unreacted layer of the barrier metal film in an appropriate way, it is preferable to set the original thickness of the barrier metal film at the bottom of the hole to be as much as 10 nm or more. In effect, the use of the anisotropic sputtering method that is characterized in high directivity towards the direction normal to the substrate surface can make the barrier metal film lying on the sidewall of the hole thin, but, at the same time, the film at the bottom of the hole thick. This facilitates to form the structure of the present invention, that is, the layered structure of the alloy layer and the unreacted layer of the barrier metal film in a favourable way. In practice, the collimate sputtering method, the long throw sputtering method, the ion metal plasma method or the like can be used as the anisotropic sputtering method.

EXAMPLE FOR REFERENCE 1

After a copper film with a thickness of 300 nm was formed on a silicon substrate by the electroplating method, a barrier metal film with a thickness of 15 nm was formed thereon. Using different materials for the barrier metal film, two groups of samples, one with tantalum nitride and the other with titanium nitride, were prepared. The deposition of these films was carried out by the reactive sputtering method. After the barrier metal film was grown, a tungsten film was deposited at various temperatures shown in FIG. 14. The method of deposition was the CVD method and the film thickness was set to be 400 nm or so. The conditions for growing the copper film, the barrier metal film and the tungsten film were the same as those in Example 1 and Example 2.

Figure 14:
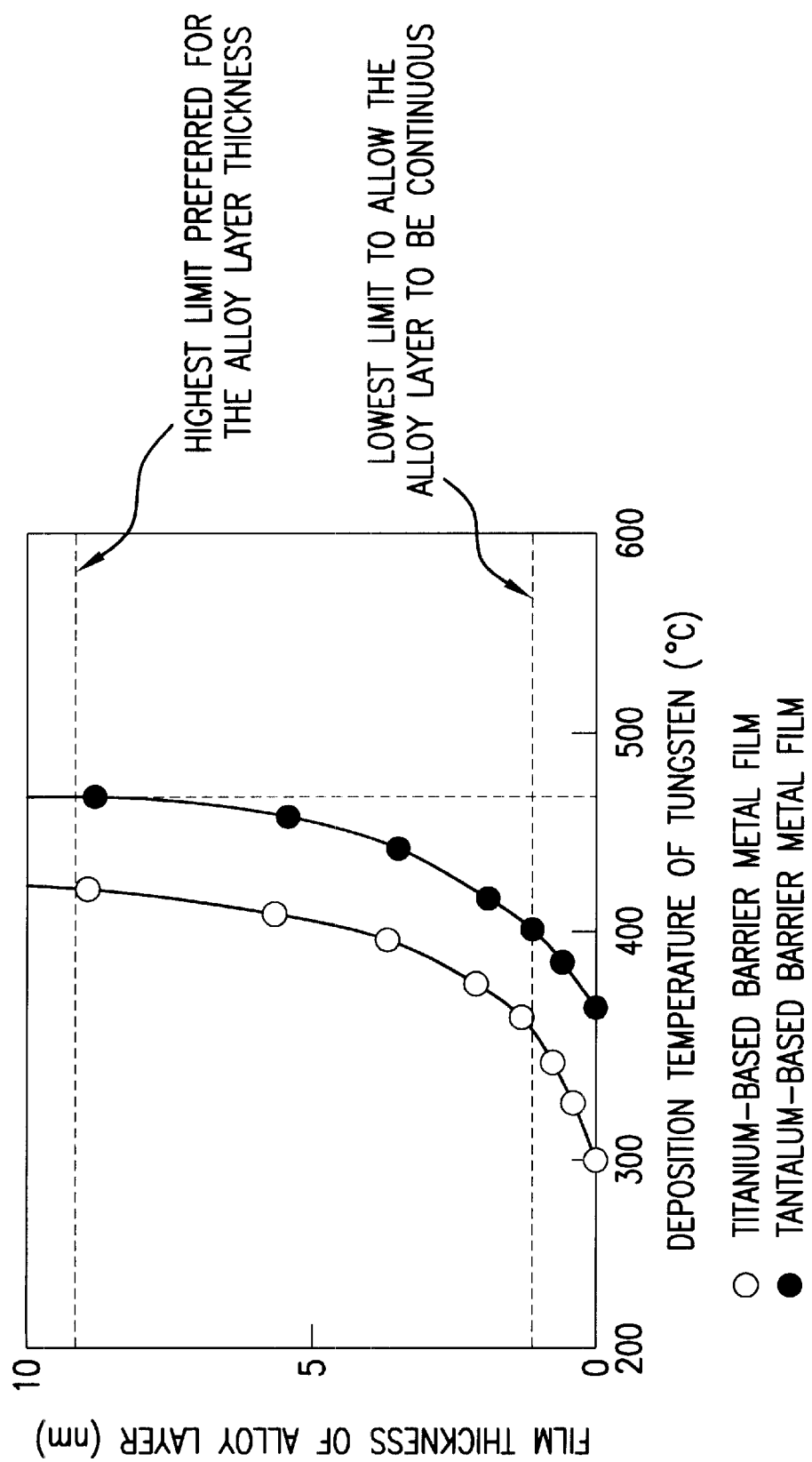
FIG. 14 is a graph showing the relationship between the deposition temperature of tungsten and the film thickness of the alloy layer.

Cross-sections of the multi-layered films that were manufactured as described above were then observed by a SEM and the film thickness of the alloy layer in each micrograph was measured. The results are shown in FIG. 14.

If the alloy layer fills the role of improving the adhesion between the tungsten film and the copper film, it is essential that the alloy layer is formed as a continuous layer. In order to ensure that the alloy layer is formed as a continuous layer, the film thickness thereof is preferably set not less than 1 nm.

On the other hand, to maintain the very function of the barrier metal film, the thickness of the barrier metal film remained without reacting is preferably kept as much as 40% or so of the original thickness at the time of film deposition. In the case of the present example for reference, the film thickness of the barrier metal film at the time of film deposition is 15 nm. If the film thickness of the alloy layer is not greater than 9 nm, the function of the barrier metal film can be maintained and, at the same time, the adhesion with the tungsten film can be prevented from lowering.

Therefore, in the present example for reference wherein the thickness of the barrier metal film is 15 nm, the lowest limit of the alloy layer thickness is preferably 1 nm or more. Against this, the highest limit is preferably 9 nm or less. To obtain an alloy layer with a thickness in this range the deposition temperature is preferably set as follows. In the case of titanium-based barrier metal film, the deposition temperature is set preferably not lower than 350° C. and more preferably not lower than 360° C., but preferably not higher than 420° C. and more preferably not higher than 400° C. In the case of tantalum-based barrier metal film, the deposition temperature is set preferably not lower than 400° C. and more preferably not lower than 420° C., but preferably not higher than 480° C. and more preferably not higher than 470° C.

EXAMPLE FOR REFERENCE 2

Figure 15:
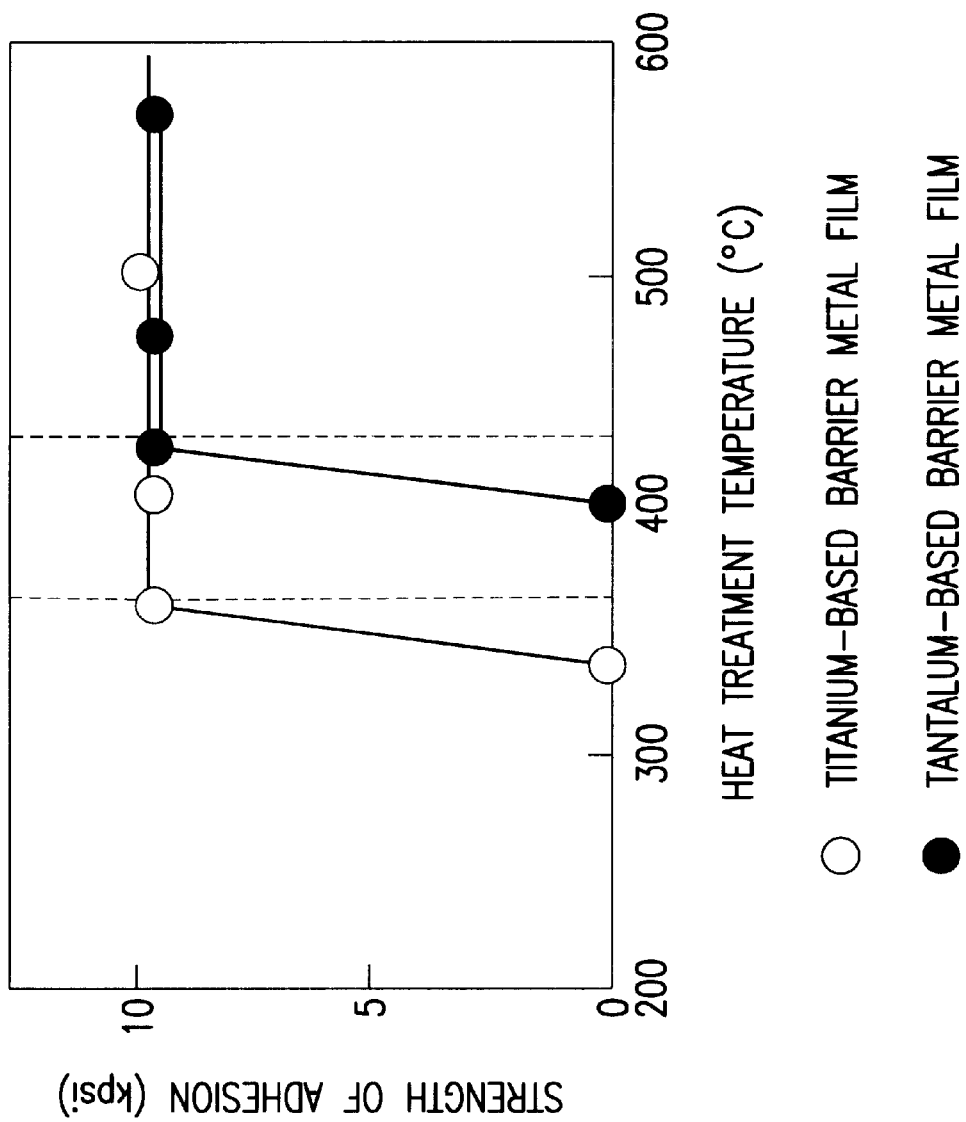
FIG. 15 is a graph showing the effect of the heat treatment temperature on the adhesion between copper and the barrier metal film.

After a copper film (with a thickness of 500 nm) was formed on the surface of a silicon substrate by the electroplating method, a barrier metal film with a thickness of 30 nm was formed thereon. Using different materials for the barrier metal film, two groups of samples, one with tantalum nitride and the other with titanium nitride, were prepared. The deposition of these films was carried out by the reactive sputtering method. The conditions for growing the copper film and the barrier metal film were the same as those in Example 1 and Example 2. After the barrier metal film was grown, a heat treatment was performed at various temperatures shown in FIG. 15. After that, onto the barrier metal film, the movable section of a tensible tester was connected through a pad made of epoxy resin, and, with the substrate being fixed, tensible tests were conducted. The results are shown in FIG. 15. These results clearly indicate that, in the present example for reference, the adhesion markedly improves when the temperature of the heat treatment increases; for the titanium-based film, above approximately 350° C. and for the tantalum-based film, above approximately 420° C.

As described above, in the present invention, between a barrier metal film and an interconnection layer made of copper-based metal, there is formed an alloy layer made through the reaction of the material of the barrier metal film and copper-based metal. This improves adhesion on the interface between the barrier metal film and the interconnection layer, and thereby achieves an improvement of the electromigration resistance, an improvement of adhesion and reductions of contact resistance as well as interconnection resistance.

This application is based on Japanese patent application NO HEI11-267444, the content of which is incorporated hereinto by reference.

What is claimed is:

1. A semiconductor device which has, on a semiconductor substrate:
   an interconnection layer made of copper-based metal; and
   a via plug formed in contact with the upper surface of said interconnection layer; wherein,
      said via plug comprises a conductive film and a barrier metal film that covers the lateral and bottom surfaces of said conductive film; and
      said barrier metal film covering the bottom surface of the conductive film and said interconnection layer are separated by an alloy layer made through the reaction of the material of said barrier metal film and said copper-based metal.

2. The semiconductor device according to claim 1, wherein the material of said barrier metal film contains titanium.

3. The semiconductor device according to claim 1, wherein the material of said barrier metal film contains tantalum.

4. The semiconductor device according to claim 3, wherein said barrier metal film is a layered film in which a tantalum film and a tantalum nitride film are laid in this order.

5. The device of claim 1, wherein said conductive film comprises tungsten.

6. The device of claim 1, wherein said alloy layer is at least 1 nm thick.

7. A semiconductor device comprising:
   a copper-based interconnection layer having an upper surface; and
   a via plug contacting said upper surface, said via plug comprising sides and a bottom of a barrier metal film and a tungsten layer on said barrier metal film,
   said bottom of said barrier metal film having a first portion directly contacting said copper-based interconnection layer that is an alloy of a metal of said barrier metal film and copper, and a second portion on said first portion,
   said first portion being at least one nanometer thick and less than a thickness of said barrier metal film.

8. The device of claim 7, wherein a thickness of said second portion is as much as 40% of said thickness of said barrier metal film.

* * * * *